United States Patent [19]

Yada

[11] Patent Number: 5,400,364
[45] Date of Patent: Mar. 21, 1995

[54] DECISION-DIRECTED DIGITAL PHASE LOCKED LOOP

[75] Inventor: Hiroaki Yada, Kanagawa, Japan

[73] Assignee: Sony Corporation, Tokyo, Japan

[21] Appl. No.: 963,905

[22] Filed: Oct. 20, 1992

[30] Foreign Application Priority Data

Oct. 25, 1991 [JP] Japan .................. 3-306643

[51] Int. Cl.$^6$ ............................................. H03L 3/18
[52] U.S. Cl. ...................................... 375/81; 375/120
[58] Field of Search .............. 375/81, 120, 17, 18;
328/139, 140, 141; 329/307, 360; 360/46, 51, 61, 65; 364/724.1

[56] References Cited

U.S. PATENT DOCUMENTS 5,166,955 11/1992 Ohta ...................................... 375/120
5,272,730 12/1993 Clark ..................................... 375/81

Primary Examiner—Stephen Chin
Assistant Examiner—T. Ghebretinsae
Attorney, Agent, or Firm—Hill, Steadman & Simpson

[57] ABSTRACT

A decision-directed phase-locked loop for not synchronizing with opposite phases where the proper data of a PRS channel reproduced signal do not exist. The loop comprises a digital loop filter, a ternary level predicting portion, a phase modification signal generating portion and an instantaneous phase detecting portion. The phase value of a future data existing point is first obtained on the basis of the phase value of the current data existing point in a reproduced signal output from the digital loop filter. The ternary level predicting portion predicts future data of the reproduced signal based on the phase value of the future data existing point and on future sampled values of the reproduced signal. Given the predicted future data, the phase modification signal generating portion checks to see if the current zero cross point of the reproduced signal is a data existing point. If the current zero cross point is found to be a data existing point, the digital loop filter modifies its output phase value using the instantaneous phase value supplied by the instantaneous phase detecting portion.

8 Claims, 31 Drawing Sheets

F I G. 4
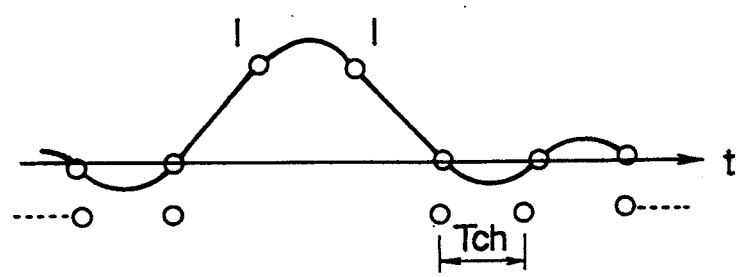
F I G. 5
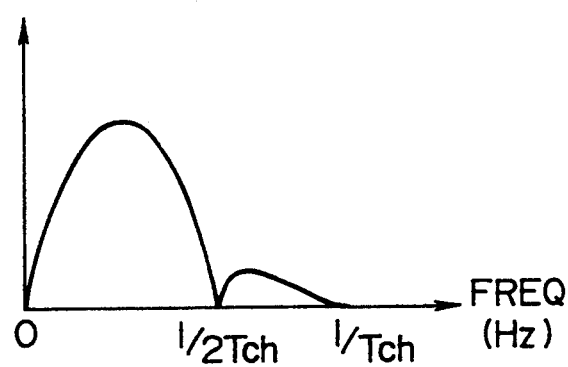

FIG. 7

| ROM LOCATIONS | | $S_{k+1}$ | $S_k$ | $\Delta P_{k+1}$ (BEFORE CONVERSION TO INTEGER FORM) | |
|---|---|---|---|---|---|
| DECIMAL | HEXADECIMAL | | | | |
| 0  | 0 0  | 0 | 0  | 0 | 0. |
| 1  | 0 1  | 0 | 1  | 0 | 0. |
| 2  | 0 2  | 0 | 2  | 0 | 0. |
| 3  | 0 3  | 0 | 3  | 0 | 0. |
| 4  | 0 4  | 0 | 4  | 0 | 0. |
| 5  | 0 5  | 0 | 5  | 0 | 0. |
| 6  | 0 6  | 0 | 6  | 0 | 0. |
| 7  | 0 7  | 0 | 7  | 0 | 0. |
| 8  | 0 8  | 0 | -8 | 0 | 0. |
| 9  | 0 9  | 0 | -7 | 0 | 0. |
| 10 | 0 10 | 0 | -6 | 0 | 0. |
| 11 | 0 11 | 0 | -5 | 0 | 0. |
| 12 | 0 12 | 0 | -4 | 0 | 0. |
| 13 | 0 13 | 0 | -3 | 0 | 0. |
| 14 | 0 14 | 0 | -2 | 0 | 0. |
| 15 | 0 15 | 0 | -1 | 0 | 0. |
| 16 | 1 0  | 1 | 0  | 8 | 8.00000 |
| 17 | 1 1  | 1 | 1  | 0 | 0. |
| 18 | 1 2  | 1 | 2  | 0 | 0. |
| 19 | 1 3  | 1 | 3  | 0 | 0. |
| 20 | 1 4  | 1 | 4  | 0 | 0. |
| 21 | 1 5  | 1 | 5  | 0 | 0. |
| 22 | 1 6  | 1 | 6  | 0 | 0. |
| 23 | 1 7  | 1 | 7  | 0 | 0. |
| 24 | 1 8  | 1 | -8 | 1 | 0.888889 |
| 25 | 1 9  | 1 | -7 | 1 | 1.00000 |
| 26 | 1 10 | 1 | -6 | 1 | 1.14286 |
| 27 | 1 11 | 1 | -5 | 1 | 1.33333 |
| 28 | 1 12 | 1 | -4 | 2 | 1.60000 |
| 29 | 1 13 | 1 | -3 | 2 | 2.00000 |
| 30 | 1 14 | 1 | -2 | 3 | 2.66667 |
| 31 | 1 15 | 1 | -1 | 4 | 4.00000 |

FIG. 8

| ROM LOCATIONS | | $S_{K+1}$ | $S_K$ | $\Delta P_{K+1}$ (BEFORE CONVERSION TO INTEGER FORM) | |
|---|---|---|---|---|---|
| DECIMAL | HEXADECIMAL | ↓ | ↓ | ↑ | |
| 32 | 2 | 0 | 2 | 0 | 8 | 8.00000 |
| 33 | 2 | 1 | 2 | 1 | 0 | 0. |
| 34 | 2 | 2 | 2 | 2 | 0 | 0. |
| 35 | 2 | 3 | 2 | 3 | 0 | 0. |
| 36 | 2 | 4 | 2 | 4 | 0 | 0. |
| 37 | 2 | 5 | 2 | 5 | 0 | 0. |
| 38 | 2 | 6 | 2 | 6 | 0 | 0. |
| 39 | 2 | 7 | 2 | 7 | 0 | 0. |
| 40 | 2 | 8 | 2 | -8 | 2 | 1.60000 |
| 41 | 2 | 9 | 2 | -7 | 2 | 1.77778 |
| 42 | 2 | 10 | 2 | -6 | 2 | 2.00000 |
| 43 | 2 | 11 | 2 | -5 | 2 | 2.28571 |
| 44 | 2 | 12 | 2 | -4 | 3 | 2.66667 |
| 45 | 2 | 13 | 2 | -3 | 3 | 3.20000 |
| 46 | 2 | 14 | 2 | -2 | 4 | 4.00000 |
| 47 | 2 | 15 | 2 | -1 | 5 | 5.33333 |
| 48 | 3 | 0 | 3 | 0 | 8 | 8.00000 |
| 49 | 3 | 1 | 3 | 1 | 0 | 0. |
| 50 | 3 | 2 | 3 | 2 | 0 | 0. |
| 51 | 3 | 3 | 3 | 3 | 0 | 0. |
| 52 | 3 | 4 | 3 | 4 | 0 | 0. |
| 53 | 3 | 5 | 3 | 5 | 0 | 0. |
| 54 | 3 | 6 | 3 | 6 | 0 | 0. |
| 55 | 3 | 7 | 3 | 7 | 0 | 0. |
| 56 | 3 | 8 | 3 | -8 | 2 | 2.18182 |
| 57 | 3 | 9 | 3 | -7 | 2 | 2.40000 |
| 58 | 3 | 10 | 3 | -6 | 3 | 2.66667 |
| 59 | 3 | 11 | 3 | -5 | 3 | 3.00000 |
| 60 | 3 | 12 | 3 | -4 | 3 | 3.42857 |
| 61 | 3 | 13 | 3 | -3 | 4 | 4.00000 |
| 62 | 3 | 14 | 3 | -2 | 5 | 4.80000 |
| 63 | 3 | 15 | 3 | -1 | 6 | 6.00000 |

FIG. 9

| ROM LOCATIONS | | $S_{k+1}$ | $S_k$ | $\Delta P_{k+1}$ (BEFORE CONVERSION TO INTEGER FORM) | |
|---|---|---|---|---|---|
| DECIMAL | HEXADECIMAL | | | | |
| 64 | 4 0 | 4 | 0 | 8 | 8.00000 |
| 65 | 4 1 | 4 | 1 | 0 | 0. |
| 66 | 4 2 | 4 | 2 | 0 | 0. |
| 67 | 4 3 | 4 | 3 | 0 | 0. |
| 68 | 4 4 | 4 | 4 | 0 | 0. |
| 69 | 4 5 | 4 | 5 | 0 | 0. |
| 70 | 4 6 | 4 | 6 | 0 | 0. |
| 71 | 4 7 | 4 | 7 | 0 | 0. |
| 72 | 4 8 | 4 | −8 | 3 | 2.66667 |
| 73 | 4 9 | 4 | −7 | 3 | 2.90909 |
| 74 | 4 10 | 4 | −6 | 3 | 3.20000 |
| 75 | 4 11 | 4 | −5 | 4 | 3.55556 |
| 76 | 4 12 | 4 | −4 | 4 | 4.00000 |
| 77 | 4 13 | 4 | −3 | 5 | 4.57143 |
| 78 | 4 14 | 4 | −2 | 5 | 5.33333 |
| 79 | 4 15 | 4 | −1 | 6 | 6.40000 |
| 80 | 5 0 | 5 | 0 | 8 | 8.00000 |
| 81 | 5 1 | 5 | 1 | 0 | 0. |
| 82 | 5 2 | 5 | 2 | 0 | 0. |
| 83 | 5 3 | 5 | 3 | 0 | 0. |
| 84 | 5 4 | 5 | 4 | 0 | 0. |
| 85 | 5 5 | 5 | 5 | 0 | 0. |
| 86 | 5 6 | 5 | 6 | 0 | 0. |
| 87 | 5 7 | 5 | 7 | 0 | 0. |
| 88 | 5 8 | 5 | −8 | 3 | 3.07692 |
| 89 | 5 9 | 5 | −7 | 3 | 3.33333 |
| 90 | 5 10 | 5 | −6 | 4 | 3.63636 |
| 91 | 5 11 | 5 | −5 | 4 | 4.00000 |
| 92 | 5 12 | 5 | −4 | 4 | 4.44444 |
| 93 | 5 13 | 5 | −3 | 5 | 5.00000 |
| 94 | 5 14 | 5 | −2 | 6 | 5.71429 |
| 95 | 5 15 | 5 | −1 | 7 | 6.66667 |

FIG. 10

| ROM LOCATIONS | | $S_{k+1}$ | $S_k$ | $\Delta P_{k+1}$ (BEFORE CONVERSION TO INTEGER FORM) | |
|---|---|---|---|---|---|
| DECIMAL | HEXADECIMAL | | | | |
| 96  | 6 | 0  | 6 | 0  | 8 | 8.00000 |
| 97  | 6 | 1  | 6 | 1  | 0 | 0. |
| 98  | 6 | 2  | 6 | 2  | 0 | 0. |
| 99  | 6 | 3  | 6 | 3  | 0 | 0. |
| 100 | 6 | 4  | 6 | 4  | 0 | 0. |
| 101 | 6 | 5  | 6 | 5  | 0 | 0. |
| 102 | 6 | 6  | 6 | 6  | 0 | 0. |
| 103 | 6 | 7  | 6 | 7  | 0 | 0. |
| 104 | 6 | 8  | 6 | -8 | 3 | 3.42857 |
| 105 | 6 | 9  | 6 | -7 | 4 | 3.69231 |
| 106 | 6 | 10 | 6 | -6 | 4 | 4.00000 |
| 107 | 6 | 11 | 6 | -5 | 4 | 4.36364 |
| 108 | 6 | 12 | 6 | -4 | 5 | 4.80000 |
| 109 | 6 | 13 | 6 | -3 | 5 | 5.33333 |
| 110 | 6 | 14 | 6 | -2 | 6 | 6.00000 |
| 111 | 6 | 15 | 6 | -1 | 7 | 6.85714 |
| 112 | 7 | 0  | 7 | 0  | 8 | 8.00000 |
| 113 | 7 | 1  | 7 | 1  | 0 | 0. |
| 114 | 7 | 2  | 7 | 2  | 0 | 0. |
| 115 | 7 | 3  | 7 | 3  | 0 | 0. |
| 116 | 7 | 4  | 7 | 4  | 0 | 0. |
| 117 | 7 | 5  | 7 | 5  | 0 | 0. |
| 118 | 7 | 6  | 7 | 6  | 0 | 0. |
| 119 | 7 | 7  | 7 | 7  | 0 | 0. |
| 120 | 7 | 8  | 7 | -8 | 4 | 3.73333 |
| 121 | 7 | 9  | 7 | -7 | 4 | 4.00000 |
| 122 | 7 | 10 | 7 | -6 | 4 | 4.30769 |
| 123 | 7 | 11 | 7 | -5 | 5 | 4.66667 |
| 124 | 7 | 12 | 7 | -4 | 5 | 5.09091 |
| 125 | 7 | 13 | 7 | -3 | 6 | 5.60000 |
| 126 | 7 | 14 | 7 | -2 | 6 | 6.22222 |
| 127 | 7 | 15 | 7 | -1 | 7 | 7.00000 |

FIG. 11

| ROM LOCATIONS | | $S_{K+1}$ | $S_K$ | $\Delta P_{K+1}$ (BEFORE CONVERSION TO INTEGER FORM) | |
|---|---|---|---|---|---|
| DECIMAL | HEXADECIMAL | | | | |
| 128 | 8   0  | −8 | 0  | 8 | 8.00000 |
| 129 | 8   1  | −8 | 1  | 7 | 7.11111 |
| 130 | 8   2  | −8 | 2  | 6 | 6.40000 |
| 131 | 8   3  | −8 | 3  | 6 | 5.81818 |
| 132 | 8   4  | −8 | 4  | 5 | 5.33333 |
| 133 | 8   5  | −8 | 5  | 5 | 4.92308 |
| 134 | 8   6  | −8 | 6  | 5 | 4.57143 |
| 135 | 8   7  | −8 | 7  | 4 | 4.26667 |
| 136 | 8   8  | −8 | −8 | 0 | 0. |
| 137 | 8   9  | −8 | −7 | 0 | 0. |
| 138 | 8   10 | −8 | −6 | 0 | 0. |
| 139 | 8   11 | −8 | −5 | 0 | 0. |
| 140 | 8   12 | −8 | −4 | 0 | 0. |
| 141 | 8   13 | −8 | −3 | 0 | 0. |
| 142 | 8   14 | −8 | −2 | 0 | 0. |
| 143 | 8   15 | −8 | −1 | 0 | 0. |
| 144 | 9   0  | −7 | 0  | 8 | 8.00000 |
| 145 | 9   1  | −7 | 1  | 7 | 7.00000 |
| 146 | 9   2  | −7 | 2  | 6 | 6.22222 |
| 147 | 9   3  | −7 | 3  | 6 | 5.60000 |
| 148 | 9   4  | −7 | 4  | 5 | 5.09091 |
| 149 | 9   5  | −7 | 5  | 5 | 4.66667 |
| 150 | 9   6  | −7 | 6  | 4 | 4.30769 |
| 151 | 9   7  | −7 | 7  | 4 | 4.00000 |
| 152 | 9   8  | −7 | −8 | 0 | 0. |
| 153 | 9   9  | −7 | −7 | 0 | 0. |
| 154 | 9   10 | −7 | −6 | 0 | 0. |
| 155 | 9   11 | −7 | −5 | 0 | 0. |
| 156 | 9   12 | −7 | −4 | 0 | 0. |
| 157 | 9   13 | −7 | −3 | 0 | 0. |
| 158 | 9   14 | −7 | −2 | 0 | 0. |
| 159 | 9   15 | −7 | −1 | 0 | 0. |

| ROM LOCATIONS DECIMAL | HEXADECIMAL | | $S_{k+1}$ | $S_k$ | $\Delta P_{k+1}$ (BEFORE CONVERSION TO INTEGER FORM) | |
|---|---|---|---|---|---|---|
| 160 | 10 | 0 | -6 | 0 | 8 | 8.00000 |
| 161 | 10 | 1 | -6 | 1 | 7 | 6.85714 |
| 162 | 10 | 2 | -6 | 2 | 6 | 6.00000 |
| 163 | 10 | 3 | -6 | 3 | 5 | 5.33333 |
| 164 | 10 | 4 | -6 | 4 | 5 | 4.80000 |
| 165 | 10 | 5 | -6 | 5 | 4 | 4.36364 |
| 166 | 10 | 6 | -6 | 6 | 4 | 4.00000 |
| 167 | 10 | 7 | -6 | 7 | 4 | 3.69231 |
| 168 | 10 | 8 | -6 | -8 | 0 | 0. |
| 169 | 10 | 9 | -6 | -7 | 0 | 0. |
| 170 | 10 | 10 | -6 | -6 | 0 | 0. |
| 171 | 10 | 11 | -6 | -5 | 0 | 0. |
| 172 | 10 | 12 | -6 | -4 | 0 | 0. |
| 173 | 10 | 13 | -6 | -3 | 0 | 0. |
| 174 | 10 | 14 | -6 | -2 | 0 | 0. |
| 175 | 10 | 15 | -6 | -1 | 0 | 0. |
| 176 | 11 | 0 | -5 | 0 | 8 | 8.00000 |
| 177 | 11 | 1 | -5 | 1 | 7 | 6.66667 |
| 178 | 11 | 2 | -5 | 2 | 6 | 5.71429 |
| 179 | 11 | 3 | -5 | 3 | 5 | 5.00000 |
| 180 | 11 | 4 | -5 | 4 | 4 | 4.44444 |
| 181 | 11 | 5 | -5 | 5 | 4 | 4.00000 |
| 182 | 11 | 6 | -5 | 6 | 4 | 3.63636 |
| 183 | 11 | 7 | -5 | 7 | 3 | 3.33333 |
| 184 | 11 | 8 | -5 | -8 | 0 | 0. |
| 185 | 11 | 9 | -5 | -7 | 0 | 0. |
| 186 | 11 | 10 | -5 | -6 | 0 | 0. |
| 187 | 11 | 11 | -5 | -5 | 0 | 0. |
| 188 | 11 | 12 | -5 | -4 | 0 | 0. |
| 189 | 11 | 13 | -5 | -3 | 0 | 0. |
| 190 | 11 | 14 | -5 | -2 | 0 | 0. |
| 191 | 11 | 15 | -5 | -1 | 0 | 0. |

FIG. 13

| ROM LOCATIONS | | | $S_{k+1}$ | $S_k$ | $\Delta P_{k+1}$ (BEFORE CONVERSION TO INTEGER FORM) | |
|---|---|---|---|---|---|---|
| DECIMAL | HEXADECIMAL | | | | | |
| 192 | 12 | 0 | −4 | 0 | 8 | 8.00000 |
| 193 | 12 | 1 | −4 | 1 | 6 | 6.40000 |
| 194 | 12 | 2 | −4 | 2 | 5 | 5.33333 |
| 195 | 12 | 3 | −4 | 3 | 5 | 4.57143 |
| 196 | 12 | 4 | −4 | 4 | 4 | 4.00000 |
| 197 | 12 | 5 | −4 | 5 | 4 | 3.55556 |
| 198 | 12 | 6 | −4 | 6 | 3 | 3.20000 |
| 199 | 12 | 7 | −4 | 7 | 3 | 2.90909 |
| 200 | 12 | 8 | −4 | −8 | 0 | 0. |
| 201 | 12 | 9 | −4 | −7 | 0 | 0. |
| 202 | 12 | 10 | −4 | −6 | 0 | 0. |
| 203 | 12 | 11 | −4 | −5 | 0 | 0. |
| 204 | 12 | 12 | −4 | −4 | 0 | 0. |
| 205 | 12 | 13 | −4 | −3 | 0 | 0. |
| 206 | 12 | 14 | −4 | −2 | 0 | 0. |
| 207 | 12 | 15 | −4 | −1 | 0 | 0. |
| 208 | 13 | 0 | −3 | 0 | 8 | 8.00000 |
| 209 | 13 | 1 | −3 | 1 | 6 | 6.00000 |
| 210 | 13 | 2 | −3 | 2 | 5 | 4.80000 |
| 211 | 13 | 3 | −3 | 3 | 4 | 4.00000 |
| 212 | 13 | 4 | −3 | 4 | 3 | 3.42857 |
| 213 | 13 | 5 | −3 | 5 | 3 | 3.00000 |
| 214 | 13 | 6 | −3 | 6 | 3 | 2.66667 |
| 215 | 13 | 7 | −3 | 7 | 2 | 2.40000 |
| 216 | 13 | 8 | −3 | −8 | 0 | 0. |
| 217 | 13 | 9 | −3 | −7 | 0 | 0. |
| 218 | 13 | 10 | −3 | −6 | 0 | 0. |
| 219 | 13 | 11 | −3 | −5 | 0 | 0. |
| 220 | 13 | 12 | −3 | −4 | 0 | 0. |
| 221 | 13 | 13 | −3 | −3 | 0 | 0. |
| 222 | 13 | 14 | −3 | −2 | 0 | 0. |
| 223 | 13 | 15 | −3 | −1 | 0 | 0. |

FIG. 14

| ROM LOCATIONS | | | $S_{K+1}$ | $S_K$ | $\Delta P_{K+1}$ (BEFORE CONVERSION TO INTEGER FORM) | |
|---|---|---|---|---|---|---|
| DECIMAL | HEXADECIMAL | | | | | |
| 224 | 14 | 0 | -2 | 0 | 8 | 8.00000 |
| 225 | 14 | 1 | -2 | 1 | 5 | 5.33333 |
| 226 | 14 | 2 | -2 | 2 | 4 | 4.00000 |
| 227 | 14 | 3 | -2 | 3 | 3 | 3.20000 |
| 228 | 14 | 4 | -2 | 4 | 3 | 2.66667 |
| 229 | 14 | 5 | -2 | 5 | 2 | 2.28571 |
| 230 | 14 | 6 | -2 | 6 | 2 | 2.00000 |
| 231 | 14 | 7 | -2 | 7 | 2 | 1.77778 |
| 232 | 14 | 8 | -2 | -8 | 0 | 0. |
| 233 | 14 | 9 | -2 | -7 | 0 | 0. |
| 234 | 14 | 10 | -2 | -6 | 0 | 0. |
| 235 | 14 | 11 | -2 | -5 | 0 | 0. |
| 236 | 14 | 12 | -2 | -4 | 0 | 0. |
| 237 | 14 | 13 | -2 | -3 | 0 | 0. |
| 238 | 14 | 14 | -2 | -2 | 0 | 0. |
| 239 | 14 | 15 | -2 | -1 | 0 | 0. |
| 240 | 15 | 0 | -1 | 0 | 8 | 8.00000 |
| 241 | 15 | 1 | -1 | 1 | 4 | 4.00000 |
| 242 | 15 | 2 | -1 | 2 | 3 | 2.66667 |
| 243 | 15 | 3 | -1 | 3 | 2 | 2.00000 |
| 244 | 15 | 4 | -1 | 4 | 2 | 1.60000 |
| 245 | 15 | 5 | -1 | 5 | 1 | 1.33333 |
| 246 | 15 | 6 | -1 | 6 | 1 | 1.14286 |
| 247 | 15 | 7 | -1 | 7 | 1 | 1.00000 |
| 248 | 15 | 8 | -1 | -8 | 0 | 0. |
| 249 | 15 | 9 | -1 | -7 | 0 | 0. |
| 250 | 15 | 10 | -1 | -6 | 0 | 0. |
| 251 | 15 | 11 | -1 | -5 | 0 | 0. |
| 252 | 15 | 12 | -1 | -4 | 0 | 0. |
| 253 | 15 | 13 | -1 | -3 | 0 | 0. |
| 254 | 15 | 14 | -1 | -2 | 0 | 0. |
| 255 | 15 | 15 | -1 | -1 | 0 | 0. | else if $(-A_{th} < S_{k+2} < +A_{th})$ and $(+A_{th} < S_{k+3})$ then if $(P_p(k+3) > \Delta P_+(k+3))$ then $-A_{th} < S_o(k+3) < +A_{th}$ $\therefore d_{k+3} = 0$ else if $(P_p(k+3) > \Delta P_+(k+3))$ then $+A_{th} < S_o(k+3)$ $\therefore d_{k+3} = +1$

F I G. 18 else if $(+A_{th} < S_{k+2})$ and $(-A_{th} < S_{k+3} < +A_{th})$ then if $(P_p(k+3) > \Delta P+(k+3))$ then $+A_{th} < S_o(k+3)$ ∴ $d_{k+3} = +1$ else if $(P_p(k+3) < \Delta P+(k+3))$ then $-A_{th} < S_o(k+3) < +A_{th}$ ∴ $d_{k+3} = 0$ else if $(-A_{th} < S_{k+2} < +A_{th})$ and $(-A_{th} < S_{k+3} < +A_{th})$ then $-A_{th} < S_{0(k+3)} < +A_{th}$ $\therefore d_{k+3} = 0$ else if $(S_{k+2} < -A_{th})$ and $(-A_{th} < S_{k+3} < +A_{th})$ then if $(P_p(k+3) > \Delta P_-(k+3))$ then $S_o(k+3) < -A_{th}$ ∴ $d_{k+3} = -1$ else if $(P_p(k+3) < \Delta P_-(k+3))$ then $-A_{th} < S_o(k+3) < +A_{th}$ ∴ $d_{k+3} = 0$ else if ( (−Ath < Sk+2 < +Ath ) and (Sk+3 < −Ath ) then if (Pp(k+3) > ΔP−(k+3)) then −Ath < So(k+3) < +Ath ∴ dk+3 = 0 else if (Pp(k+3) < ΔP−(k+3)) then

Sk+3 < −Ath

∴ dk+3 = −1 else if $(S_{k+2} < -A_{th})$ and $(S_{k+3} < -A_{th})$ then $So(k+3) < -A_{th}$ ∴ $d_{k+3} = -1$ else If $(S_{k+2} < -A_{th})$ and $(+A_{th} < S_{k+3})$ then if $(Pp(k+3) > \Delta P_-(k+3))$ then $So(k+3) < -A_{th}$ $\therefore d(k+3) = -1$ else If $(\Delta P_-(k+3) > Pp(k+3) > \Delta P_+(k+3))$ then $-A_{th} < So(k+3) < +A_{th}$ $\therefore d_{k+3} = 0$ else If $(\Delta P_+(k+3) > Pp(k+3))$ then $+A_{th} < So(k+3)$ $\therefore d(k+3) = +1$ else if $(+Ath < S_{k+2})$ and $(S_{k+3} < -Ath)$ then
  if $(Pp(k+3) > \Delta P_+(k+3))$ then
    $Ath < So(k+3)$
    $\therefore dk+3 = +1$
else if $(\Delta P_+(k+3) > Pp(k+3) > \Delta P_-(k+3))$ then
  $-Ath < So(k+3) < +Ath$
  $\therefore dk+3 = 0$
else if $(\Delta P_-(k+3) > Pp(k+3))$ then
  $So(k+3) < -Ath$
  $\therefore dk+3 = -1$

DECISION-DIRECTED DIGITAL PHASE LOCKED LOOP

BACKGROUND OF THE INVENTION

1. Field of the Invention

The present invention relates to a phase-locked loop circuit that follows the phase of data existing points in a reproduced signal from a partial response (PRS) channel used typically by digital magnetic recording apparatuses.

2. Description of the Prior Art

FIG. 29 is a view of a typical reproduced signal from a PRS (1, −1) channel for magnetic recording; FIG. 30 is a view of a typical reproduced signal from a PRS (1, 0, −1) channel for magnetic recording; FIG. 31 is a view of a typical eye pattern of the reproduced signal from the PRS (1, −1) channel; and FIG. 32 is a view of a typical eye pattern of the reproduced signal from the PRS (1, 0, −1) channel. In FIGS. 29 and 30, each cross (+) symbol indicates a data existing point, i.e., a zero-degree phase. On the PRS (1, 0, −1) and PRS (1, −1) channels for magnetic recording, data exist in zero-degree phases for each ternary level (1, 0 or −1). Where the channel characteristic is properly equalized, signal waveform values converge on one of the three levels (1, 0 or −1) in a zero-degree phase. Thus the optimum way to detect timing information from this waveform is to detect the phase of zero cross points.

However, as is evident from FIGS. 29 through 32, zero cross points exist near phases other than the zero-degree phase (i.e., between zero-degree phases) on the PRS (1, 0, −1) and PRS (1, −1) channels. Take, for example, a clock reproduction circuit such as the one in FIG. 33. The circuit of FIG. 33 comprises a voltage comparator 401 that compares an input signal with a reference voltage, a bidirectional monostable multivibrator circuit 402 located on the output side of the comparator 401, and a phase-locked loop (PLL) circuit 403 of known construction which, located on the output side of the circuit 402, includes a phase comparator 406, a loop filter 408 and a VCO 407, with the clock reproduction circuit of FIG. 33, assume that an attempt is made to compare an input signal with the reference voltage to detect a zero cross phase from the comparison and to input the resulting phase to the PLL circuit for phase synchronization. In that case, as shown in FIG. 34, the monostable multivibrator circuit 402 outputs pulses incorrectly at 180-degree phases. As a result, phase synchronization is disturbed by the zero cross phase information from opposite phases, or the attempt to establish phase synchronization fails in trying to synchronize with negative phases upon the start of the synchronizing operation.

SUMMARY OF THE INVENTION

It is therefore an object of the present invention to provide a phase-locked loop circuit for preventing synchronization with opposite phases where data of a reproduced signal from a PRS channel do not exist.

In carrying out the invention and according to one aspect thereof, there is provided a decision-directed digital phase locked loop comprising: (a) instantaneous phase detecting means for obtaining the instantaneous phase digital value of a zero cross point of in a reproduced signal from a partial response channel based on a plurality of sampled values of the reproduced signal; (b) a digital loop filter for obtaining and outputting the phase value of a data existing point of the reproduced signal in response to the instantaneous phase digital value obtained by the instantaneous phase detecting means; (c) phase value predicting means for obtaining the phase value of a future data existing point based on the phase value, output by the digital loop filter, of the current data existing point of the reproduced signal; (d) data predicting means for predicting the future data of the reproduced signal based on the phase value of the future data existing point obtained by the phase value predicting means as well as on future sampled values of the reproduced signal; and (e) phase modification control means for determining, based on the future data predicted by the data predicting means, whether the current zero cross point of the reproduced signal is a data existing point, and for allowing the digital loop filter to modify the output phase value thereof using the instantaneous phase value if the current zero cross point is found to be a data existing point.

In operation, the phase value of a future data existing point is first obtained on the basis of the phase value of the current data existing point in the reproduced signal output from the digital loop filter. Future data of the reproduced signal are predicted based on the phase value of the future data existing point and on future sampled values of the reproduced signal. Given the predicted future data, a check is made to see if the current zero cross point of the reproduced signal is a data existing point. If the current zero cross point is found to be a data existing point, the digital loop filter modifies its output phase value using the instantaneous phase value of the zero cross point. This prevents phase synchronization in opposite phases where data do not exist and permits synchronism only with phases where data exist.

These and other objects, features and advantages of the invention will become more apparent upon a reading of the following description and appended drawings.

BRIEF DESCRIPTION OF THE DRAWINGS

FIG. 4 is a view of a typical isolated waveform on the PRS (1, 0, −1) channel after equalization;

FIG. 5 is a view showing a typical spectrum of the isolated waveform on the PRS (1, 0, −1) channel after equalization;

FIG. 7 is a partial view showing typical contents of the ROM table 12 in the instantaneous phase detecting portion 10 of FIG. 1;

FIG. 8 is another partial view showing typical contents of the ROM table 12 in the instantaneous phase detecting portion 10 of FIG. 1;

FIG. 9 is another partial view showing typical contents of the ROM table 12 in the instantaneous phase detecting portion 10 of FIG. 1;

FIG. 10 is another partial view showing typical contents of the ROM table 12 in the instantaneous phase detecting portion 10 of FIG. 1;

FIG. 11 is another partial view showing typical contents of the ROM table 12 in the instantaneous phase detecting portion 10 of FIG. 1;

FIG. 12 is another partial view showing typical contents of the ROM table 12 in the instantaneous phase detecting portion 10 of FIG. 1;

FIG. 13 is another partial view showing typical contents of the ROM table 12 in the instantaneous phase detecting portion 10 of FIG. 1;

FIG. 14 is another partial view showing typical contents of the ROM table 12 in the instantaneous phase detecting portion 10 of FIG. 1;

FIG. 18 is a view showing ternary level prediction determining rules in effect when the sampled value $Sk+2$ is greater than the threshold value $+Ath$, with the sampled value $Sk+3$ falling between the threshold values $-Ath$ and $+Ath$;

DESCRIPTION OF THE PREFERRED EMBODIMENT

Figure 1:
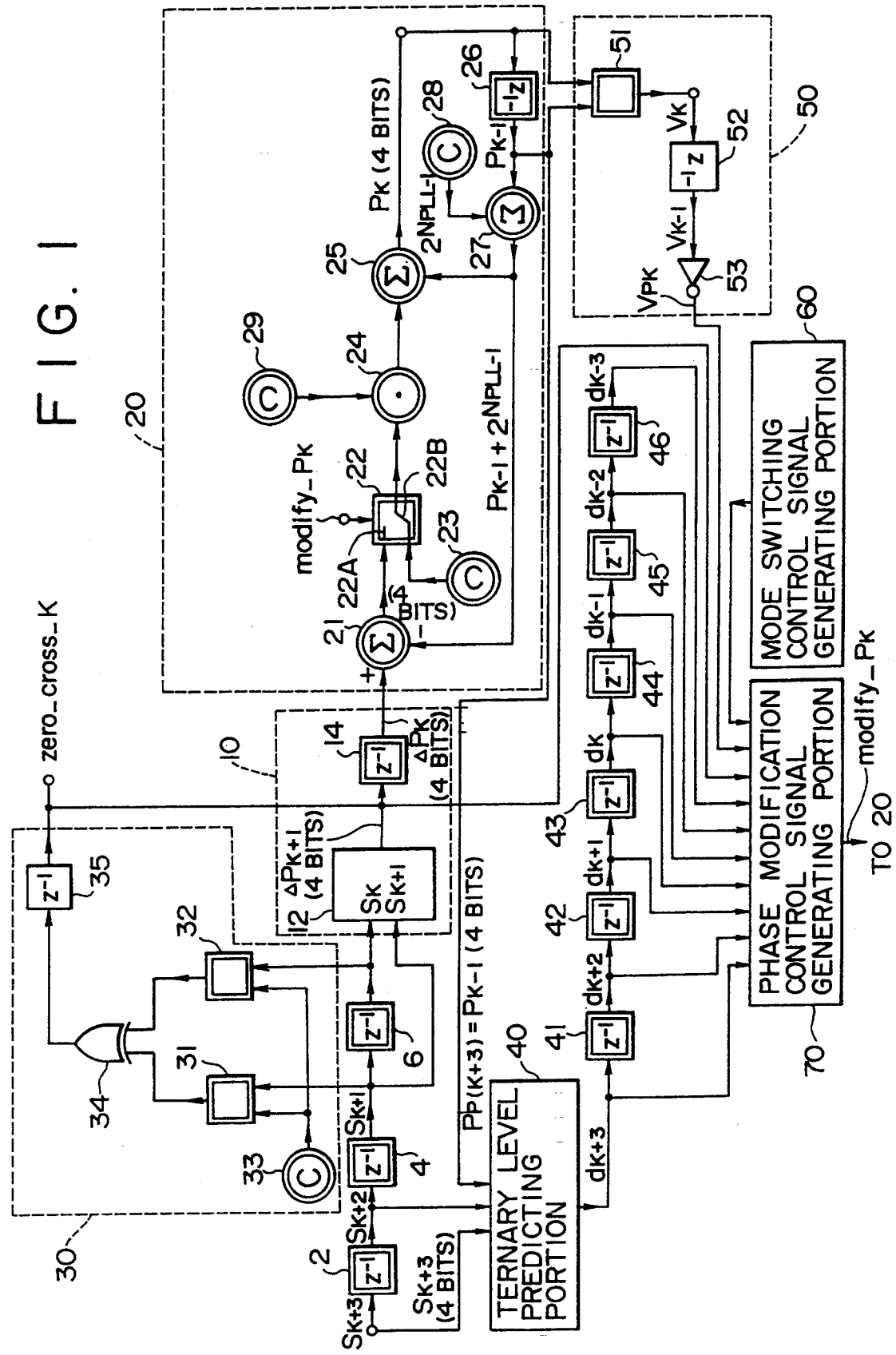
FIG. 1 is a block diagram of a phase-locked loop circuit practiced as one preferred embodiment of the invention.

FIG. 1 is a block diagram of a phase-locked loop circuit practiced as one preferred embodiment of the invention. Preparatory to describing the embodiment, a digital magnetic disc recording/reproducing apparatus to which the invention typically applies will be explained.

Figure 2:
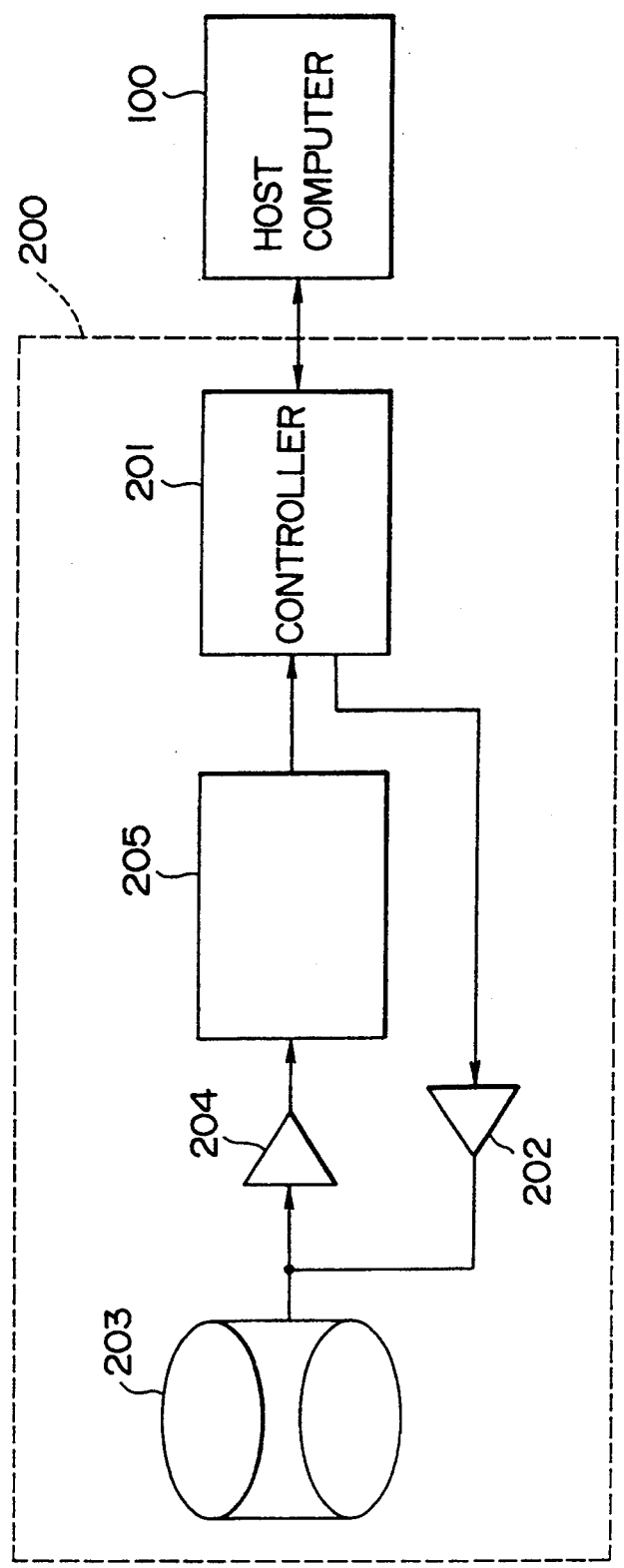
FIG. 2 is a block diagram of a digital magnetic disc recording/reproducing apparatus to which the invention is illustratively applied.

FIG. 2 is a block diagram of a digital magnetic disc recording/reproducing apparatus to which the invention applies, the diagram emphasizing the flow of data throughout the apparatus. In FIG. 2, a host computer 100 records data to a hard disk drive (HDD) subsystem 200 as follows: The host computer 100 first sends data through a bus interface to a controller 201 in the HDD subsystem 200. The controller 201 puts the received data into a format suitable for recording on a magnetic disc. The controller 201 then modulates the formatted data in a way compatible with a magnetic recording/reproduction channel and sends the data to a recording amplifier 202. The recording amplifier 202 causes recording currents to flow to the magnetic recording head inside a head disc assembly 203 for recording the data. The head disc assembly 203 is a mechanical block comprising a magnetic disc on which to record data, recording and reproduction heads, a head positioning mechanism, and a spindle motor. Data are reproduced as follows: In the head disc assembly 203, recorded magnetic patterns are read from the magnetic disc by the magnetic reproduction head. The data thus retrieved are amplified by a reproduction amplifier 204 as a reproduced signal. The reproduced signal is converted to digital data by a data detection circuit 205. The controller 201 subjects the digital data to channel demodulation and unformatting processes before sending the data to the host computer 100 through the bus interface. The present invention is applicable in particular to the data detection circuit 205 in the magnetic recording/reproducing apparatus of FIG. 2.

The primary objective for the digital magnetic recording/reproducing apparatus to utilize the PRS (1, 0, −1) channel is this: On the magnetic recording/reproduction channel which is a band limiting channel, band utilization is maximized so that data are recorded and reproduced as fast as possible in the same bandwidth. (From another point of view, this means enhancement of the linear recording density in the longitudinal direction on the recording medium.) The PRS (1, 0, −1) channel makes positive use of inter-symbol interference (i.e., interference between isolated reproduced waveforms) that occurs on a band limiting channel. Suppose that isolated waveforms (i.e., reproduced signals of isolated magnetic inversion from recording medium) are equalized into the form shown in FIG. 4. In this case, the waveform passes points 0, ..., 0, 0, 1, 1, 0, 0, ..., 0 at channel bit intervals of Tch. The frequency spectrum of this waveform is as depicted in FIG. 5, with the zero point occurring at a frequency of 1/Tch.

Clock information is detected from the observation of random data recording and reproducing waveforms generally by one of two major methods:

(1) by detecting peak points (for magnetic disc units that operate on peak detection principles); or
(2) by detecting zero cross points.

Figure 32:
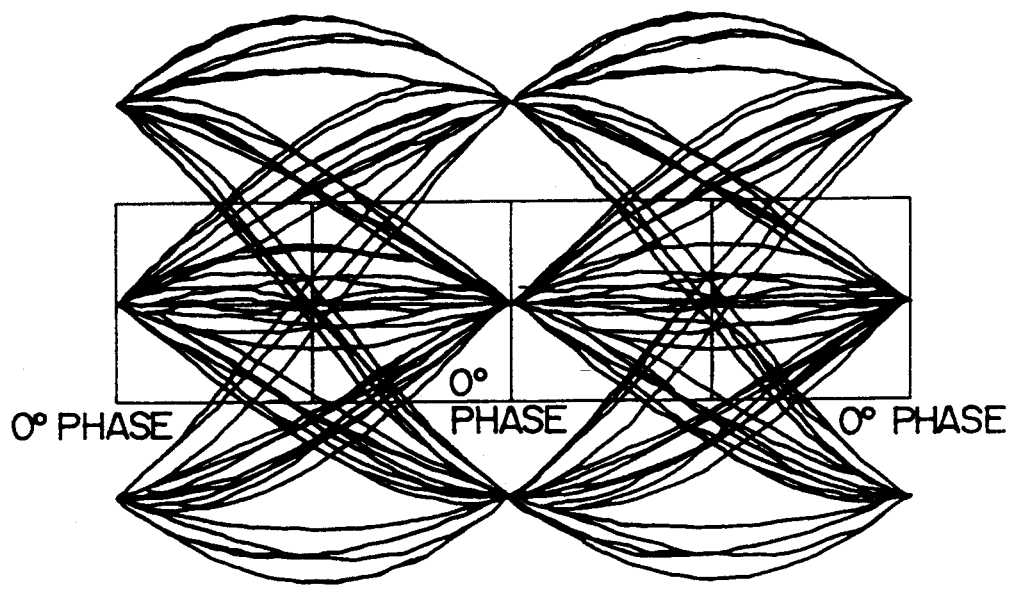
FIG. 32 is a view of a typical eye pattern waveform representing a reproduced signal from the PRS (1, 0, −1) channel.
Figure 33:
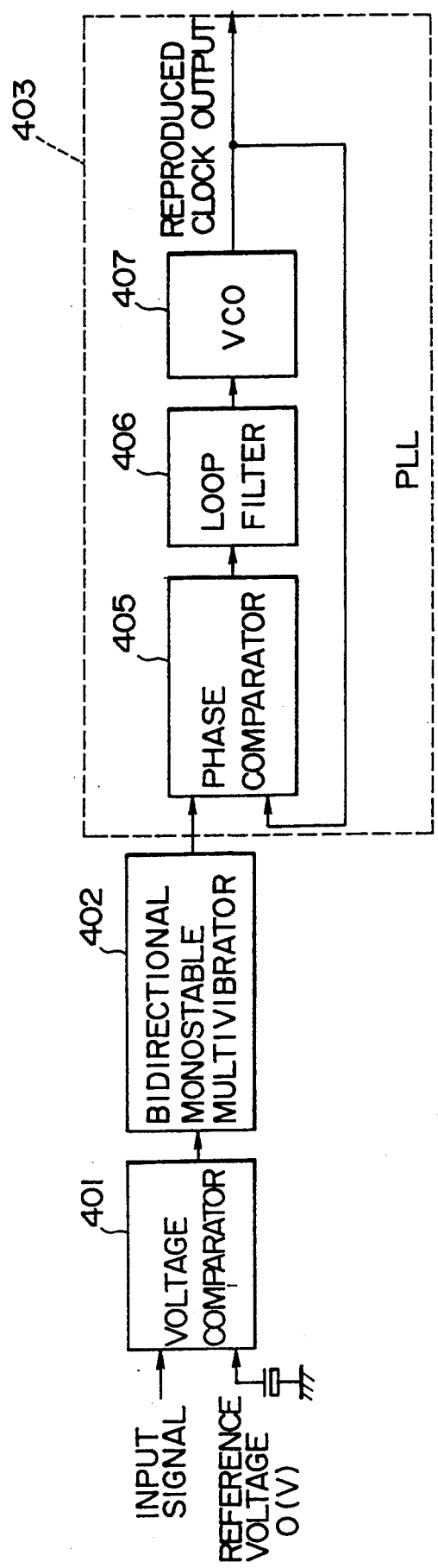
FIG. 33 is a block diagram of a typical prior art clock reproduction circuit.
Figure 34:
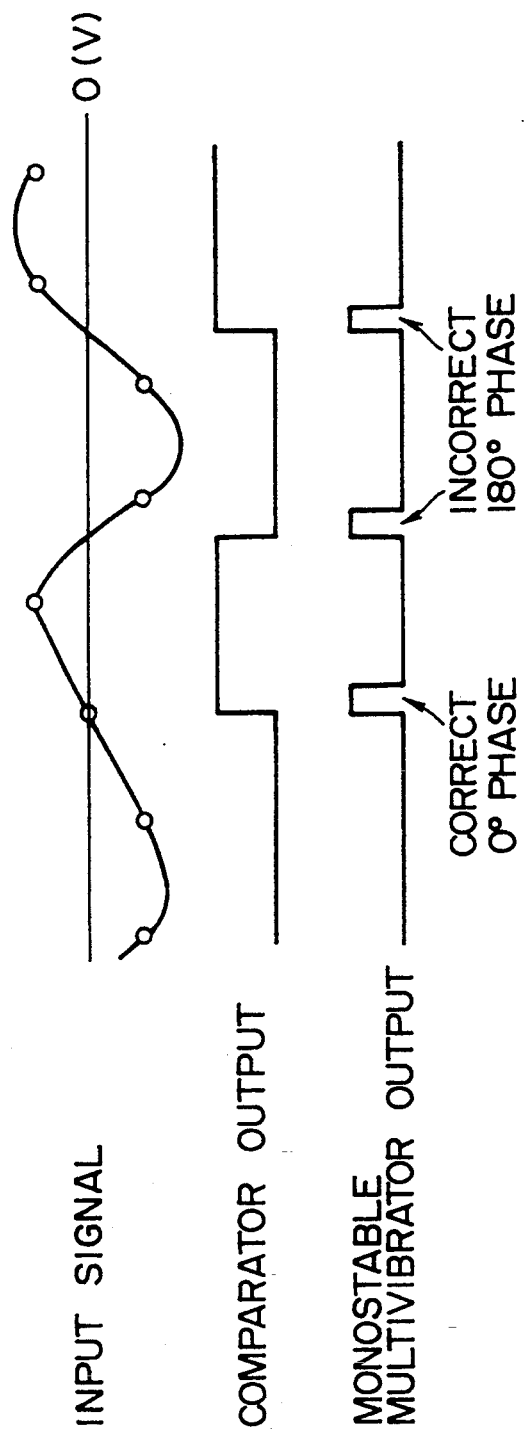
FIG. 34 is a view of waveforms representing signals output by various parts of the prior art clock reproduction circuit of FIG. 33.

Method (1) above is not usable with the PRS (1, 0, −1) channel because peaks are not acute enough, as shown in the eye pattern of FIG. 32. Where channel equalization is adequate, zero cross points neatly occur in zero-degree phases. Unfortunately, zero cross points can also occur at 180-degree phases. Not all zero cross points may be used for clock phase detection.

Figure 3:
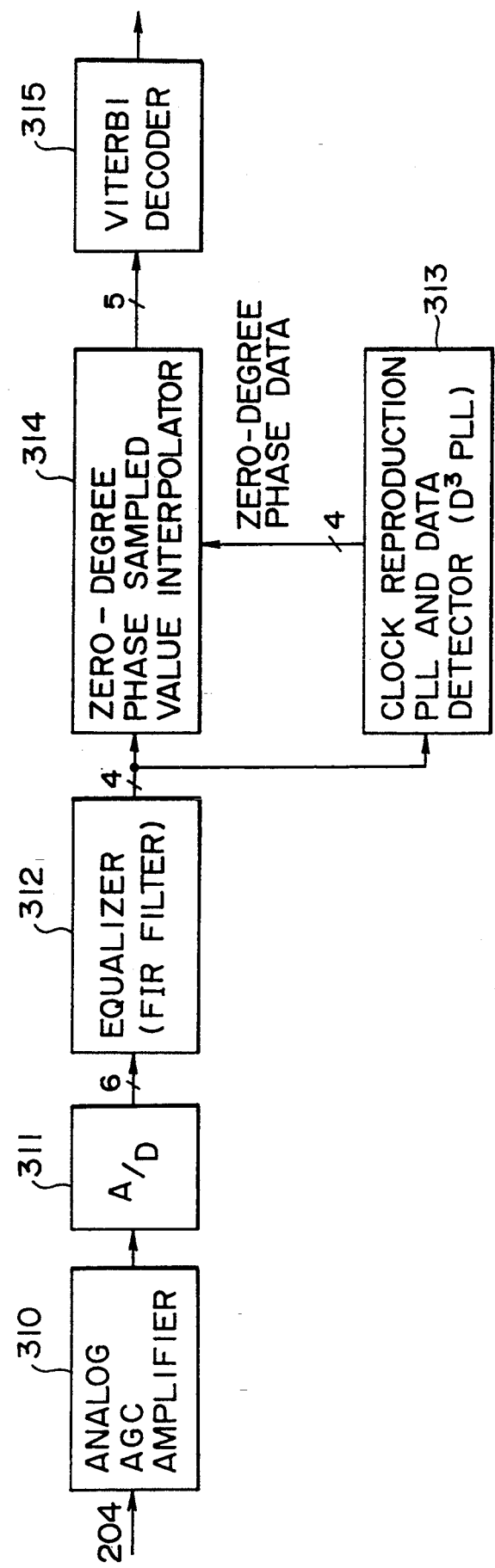
FIG. 3 is a block diagram showing a typical construction of the data detection circuit 205 in FIG. 2.

The data detection circuit 205, to which the invention applies, illustratively comprises as shown in FIG. 3 an analog AGC amplifier 310 that outputs a signal at a constant envelope level upon receiving the output of the reproduction amplifier 204, an A/D converter 311 that converts the output signal of the amplifier 310 to a digital signal, a transversal type equalizer (FIR filter) 312 that equalizes the output signal of the converter 311, a clock reproduction PLL and data detector 313 that detects zero-degree phase clock pulses from the output of the equalizer 312 to output zero-degree phase data according to the invention, a sampled value interpolator 314 that interpolates zero-degree phase sampled values on receiving the output of the equalizer 312 and the output of the detector 313, and a Viterbi decoder 315 that subjects the output of the interpolator 314 to Viterbi decoding.

In the magnetic disc apparatus, the reproduction level from the magnetic head varies depending on the present radius of the track to be reproduced. Where a number of disc surfaces and magnetic heads are varied in combination, such combinations change the reproduction level. However, for the data detection circuit 205 to provide its predetermined performance requires that the envelope level of the reproduced signal from the channel be substantially constant. This requirement must be met for the following reasons:

(1) Within the data detection circuit 205, data are represented by the fixed-point representation system to enable high-speed digital signal processing. In order for each internal word length to be utilized effectively, the level fluctuation should preferably be minimal.
(2) Ternary data detection is carried out through level comparison for decision-directed processing, as will be described later. It follows that any fluctuation in the signal level is undesirable.

It is for these reasons that the analog AGC amplifier 310 is provided to keep substantially constant the envelope level of the reproduced signal from the channel.

The A/D converter 311 samples the analog reproduced signal from the AGC amplifier 310 at a sampling frequency of fs that is a constant multiple of the channel bit rate. The sampled signal is quantized into a predetermined signal word length. Because high-speed operation is required, the converter 311 is typically implemented using a flash A/D converter. In this embodiment, the sampling frequency fs is twice the channel bit rate, which is the simplest possible arrangement.

The equalizer 312 controls the inter-symbol interference stemming from the band limiting characteristic and other aspects of the magnetic recording channel so as to fit the channel characteristic correctly to the PRS (1, 0, −1) channel. For example, the equalizer 312 is implemented using a transversal type linear equalizer composed of digital signal processing circuits.

The zero-degree phase sampled value interpolator 314 calculates sampled values at Zero-degree phase points where data exist based on the output phase from the clock reproduction PLL and data detector 313 according to the invention. The Viterbi decoder 315 outputs a correct data sequence in accordance with the sequence of the sampled values.

How the preferred embodiment of the invention works will now be described with reference to FIG. 1. The description of the workings will start at an instantaneous phase detecting portion 10. The detecting portion 10 detects instantaneous phases on the same principles as those disclosed in Japanese Patent Laid-Open No. 59-92410. As its input values, the detecting portion 10 receives two sampled values Sk+1 and Sk. The sampled value Sk+1 is a value given at a time t=(k+1)Ts, i.e., when a sampled value of Sk+3 of a reproduced signal from the PRS channel is delayed two sampling periods by pipeline registers 2 and 4; the sampled value Sk is given at time t=kTch, i.e., when the sampled value Sk+3 of the PRS channel reproduced signal is delayed three sampling periods by pipeline registers 2, 4 and 6. A ROM table 12 of the instantaneous phase detecting portion 10 outputs an instantaneous phase of ΔPk+1 based on the two continuous signal sampled values Sk+1 and Sk sampled at a fixed clock rate in asynchronism with the input signal data. The instantaneous phase ΔPk+1 is a time period ranging from the point in time t=(k+1)Ts at which the signal sampled value SK+1 exists back to the signal waveform zero cross point (zero-degree phase candidate) within the (k+1)th time slit. The values are in units of quantized phases.

The instantaneous phase ΔPk+1 represents the distance between the zero-degree phase (having a phase value of zero) and the time (k+1)Ts; it also stands for the phase value of the point in time t=(k+1)Ts. With this embodiment, a phase of 360 degrees corresponds to a digital value of $2^{NPLL}$. The time Ts for a single time slot corresponds to a phase of 180 degrees, or to $2^{NPLL-1}$ if counted in units of quantized phases.

Figure 6:
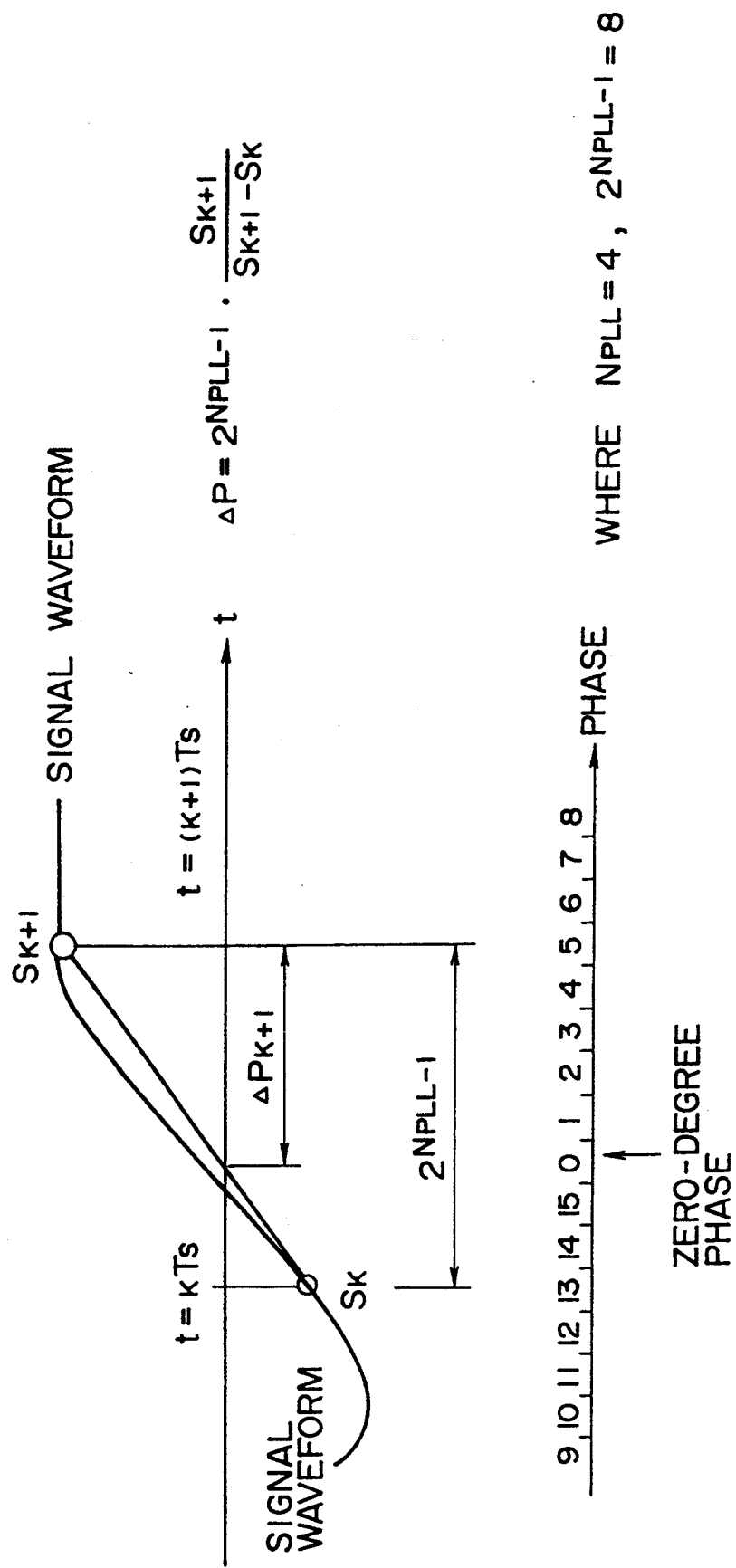
FIG. 6 is a view describing some aspects of the operating principles of the instantaneous phase detecting portion 10 in FIG. 1.

The instantaneous phase ΔPk+1 is obtained from Expression (1) below on the assumption that the signal waveform may be linearly approximated between the two continuous signal sampled values Sk+1 and Sk (see FIG. 6):

$$\Delta P_{k+1} = 2^{NPLL-i} \frac{S_{k+1}}{S_{k+1} - S_k} \tag{1}$$

where, $2^{NPLL-1}$ is the quantized phase count for one sampling period. In the case of Sk+1=Sk, the denominator can become 0. In fact, because no zero cross point occurs and because PLL phase update is not performed, there is no need to calculate ΔPk.

The ROM table 12 receives as its address input the sampled values SK+1 and Sk and outputs the instantaneous phase ΔPk+1 accordingly. FIGS. 7 through 14 are views showing typical contents of the ROM table 12 in effect when input signals are four bits long each (i.e., data in twos complements are regarded as absolute binary addresses) and zero cross phase detected output data are four bits long as well (in absolute binary representation).

The instantaneous phase is input to a loop filter (digital signal processing PLL) 20 as phase data ΔPk of, say, 4 NPLL bits. That is, with the embodiment of FIG. 1, the delay in the operation time or in the access time of the ROM table 12 is compensated in the following manner to permit high bit rate operations: First the instantaneous phase ΔPk+1 is obtained from the ROM table 12. Then one pipeline register 14 is inserted in the flow to produce a delay of one sampling period. The result is output as the phase data ΔPk.

Although the embodiment of FIG. 1 acquires the instantaneous phase ΔPk+1 from the ROM table 12, the embodiment may alternatively execute Expression (1) using a subtracter and divider arrangement in order to find the phase.

The digital loop filter 20 will now be described. The filter 20 is at least a primary phase synchronizing loop that updates the internal phase data Pk based on the instantaneous phase data ΔPk so as to follow zero-degree phases. Phase modification is available in each time slot. If a correct zero cross point of a zero-degree phase does not exist in a given time slot ((k−1)T<t<kT), no phase modification should be carried out. In that case, phase updating is performed according to Expressions (2) and (3) below using a phase modification control signal "modify_Pk" coming from a phase modification control signal generating portion 70. This embodiment utilizes a primary loop. The expressions are as follows: if (modify_Pk=0), then no phase modification is made; (PLL running by itself)

$$Pk = Pk - 1 + 2^{NPLL-1} \quad (2)$$

else if (modify_Pk=1), then phase modification is made;

$$Pk = Pk - 1 + 2^{NPLL-1} + \alpha(\Delta Pk - (Pk + 1 + 2^{NPLL-1})) \quad (3)$$

The internal phase data are supplemented by $2^{NPLL-1}$ when no phase modification is made according to Expression (2) above. This is done because, with no phase modification performed, the phase still needs to be rotated by 180 degrees due to the presence of one zero-degree phase for every two time slots on average. When phase modification is carried out according to Expression (3), the difference is obtained between the instantaneous input phase ΔPk and the PLL internal phase self-running value $(Pk-1+2^{NPLL-1})$. The amount of phase modification is acquired by multiplying that difference by a modification coefficient of α. In Expressions (2) and (3), each phase data word length is NPLL bits, and add and subtract operations are the modulo arithmetic with $2^{NPLL}$ taken as modulus. As indicated by Expression (4) below, the instantaneous phase ΔPk takes on only a positive value:

$$0 \leq \Delta Pk \leq 2^{NPLL} - 1 \quad (4)$$

The PLL internal phase Pk also takes on a positive value only, as indicated by Expression (5):

$$0 \leq Pk \leq 2^{NPLL} - 1 \quad (5)$$

The amount of phase modification α $(\Delta Pk - (Pk - 1 + 2^{NPLL-1}))$ is twos complement data that may be either positive or negative.

In the loop filter 20 of FIG. 1, the PLL internal phase Pk is retained in a phase register 26 as data of, say, 4 NPLL bits. A constant generator 28 generates a constant of $2^{NPLL-1}$. An adder 27 is a modulo $(2^{NPLL})$ adder that receives the output Pk−1 of the phase register 26 and the output $2^{NPLL-1}$ of the constant generator 28 so as to execute $(Pk-1+2^{NPLL-1})$. A subtracter 21 calculates the difference between the input instantaneous phase ΔPk and the output $(Pk-1+2^{NPLL-1})$ of the adder 27. The output of the subtracter 21 is supplied to one of two input terminals 22A of a switch 22. The other input terminal 22B is fed with the output of a constant generator 23. In this embodiment, the constant generator 23 generates 0.

The switch 22 is operated in accordance with the phase modification control signal "modify_Pk." When the signal "modify_Pk" is 1, the switch 22 is operated to connect the terminal 22A; when the signal is 0, the switch 22 is operated to connect the terminal 22B. A modification coefficient generator 29 generates the modification coefficient α. With this embodiment, the modification coefficient α is set to 0.125. A multiplier 24 multiplies the output of the switch 22 by the modification coefficient α. The subtracter 21, switch 22 and multiplier 24 determine the amount of PLL internal phase modification. The amount of phase modification thus determined is added by an adder 25 to the PLL internal phase $(Pk-1+2^{NPLL-1})$ for phase modification.

A zero cross detecting portion 30 will now be described. The first requirement to be met for PLL internal phase modification is that a signal wave zero cross point must exist in a given time slot so that an instantaneous phase may be measured. The zero cross detecting portion 30 first receives continuous two signal samples Sk+1 and Sk from the pipeline registers 4 and 6, respectively. The two signal samples are compared by comparators 31 and 32 with the output of a constant generator 33. The compare operation yields the MSB's (sign bits) of the two signal samples Sk+1 and Sk expressed in twos complement data. These MSB's are subjected to an exclusive-OR operation by an exclusive-OR gate 34 to check for the presence of a zero cross point. The result is output is a zero cross signal "zero_cross_k."

To compensate for the effects of the delay due to the exclusive-OR gate 34, the embodiment of FIG. 1 first detects beforehand a signal "zero_cross_k+1" which occurs one time slot later. The detected signal is then delayed by a pipeline register 35 to provide the zero cross signal "zero_cross_k."

The PRS (1, 0, −1) reproduced signal waveform results in zero cross points in zero-degree phases only when the ternary data sequence is . . . , 1, 0, −1, . . . , etc., or . . . , −1, 0, 1, . . . , etc. Thus it is unacceptable to obtain phase data from each and every zero cross point; new instantaneous phase data must be obtained selectively. This requires the so-called decision-directed processing. The processing involves having a ternary level predicting portion 40 carry out simple ternary level detection, the result of this presumptive data detection being used to detect the instantaneous phase selectively.

Decision-directed processing requires three data items: a future data item dk+2 of one time slot later, the current data item dk of the current time slot, and a preceding data item dk−2 of one time slot earlier. However, it should be noted that prior to the update of the time slot k, the PLL knows only the phase Pk−1; it does not know that zero-degree phase in the (k+2)th slot which is needed to detect the future data dk+2. This is the reason why Pk+3 is necessary. The predicted value Pp(k+3) in the future zero-degree phase is obtained from the PLL internal phase Pk−1 using Expression (6) below:

$$Pp(k+3) \approx Pk-1+4(2^{NPLL-1}) = Pk-1 \quad (6)$$

where, the second term in Expression (6) is zero because the add operation is carried out with modulo ($2^{NPLL}$), with the result that the expression is simplified as shown on the second line. That is, if the phase fluctuation of the input signal is small enough, the phase of four time slots later is predicted using Expression (6). In the embodiment of FIG. 1, the output Pk−1 of the phase register 28 is supplied as the predicted value Pp(k+3) of the future zero-degree phase to the ternary level predicting portion 40. Using the predicted phase Pp(k+3), the ternary level predicting portion 40 performs ternary level determination on the following principles for presumptive detection of the future data dk+3:

Suppose it is known by the PLL that a zero-degree phase exists in the (k+3)th time slot. (In fact, regardless of the presence or absence of the zero-degree phase, data are detected in all time slots for selective processing (see Expression (11)) based on the valid signal to be described later.) On this assumption, two cases are conceivable:

(A) If the input signal samples Sk+2 and Sk+3 at both ends of the current time slot exist on the same side of a threshold value, the input signal level S0(k+3) at the zero-degree phase existing point, i.e., the data existing point also exists on the same side.

(B) If one input signal sample Sk+2 exists on one side of the threshold value and the other input signal sample Sk+3 exists on the other side, primary linear interpolation is performed to calculate the signal waveform cross phase with respect to the threshold value in the current time slot (i.e., distance from t=(k+3)Ts back to the signal waveform cross point). The signal waveform cross phase is ΔP+(k+3) if the threshold value is positive, or ΔP−(k+3) if the threshold value is negative. This phase value is compared with the predicted phase Pp(k+3) (i.e., distance from the point in time t=(k+3)Ts back to the zero-degree phase predicted point in the current time slot). The result of the compare operation is used to determine on which side of the threshold value the signal S0(k+3) of the zero-degree phase predicted point exists. The determination is based on a simple comparison of levels as indicated by Expression (7) below:

$$\text{if } (+A_{th} \leq S_{0(k+3)}) \text{then} \quad (7)$$
$$d_{k+3} = +1$$

-continued
$$\text{elseif}(-A_{th} \leq S_{0(k+3)} < +A_{th}) \text{then}$$
$$d_{k+3} = 0$$
$$\text{elseif}(S_{0(k+3)} < -A_{th}) \text{then}$$
$$d_{k+3} = -1$$

Figure 15A:
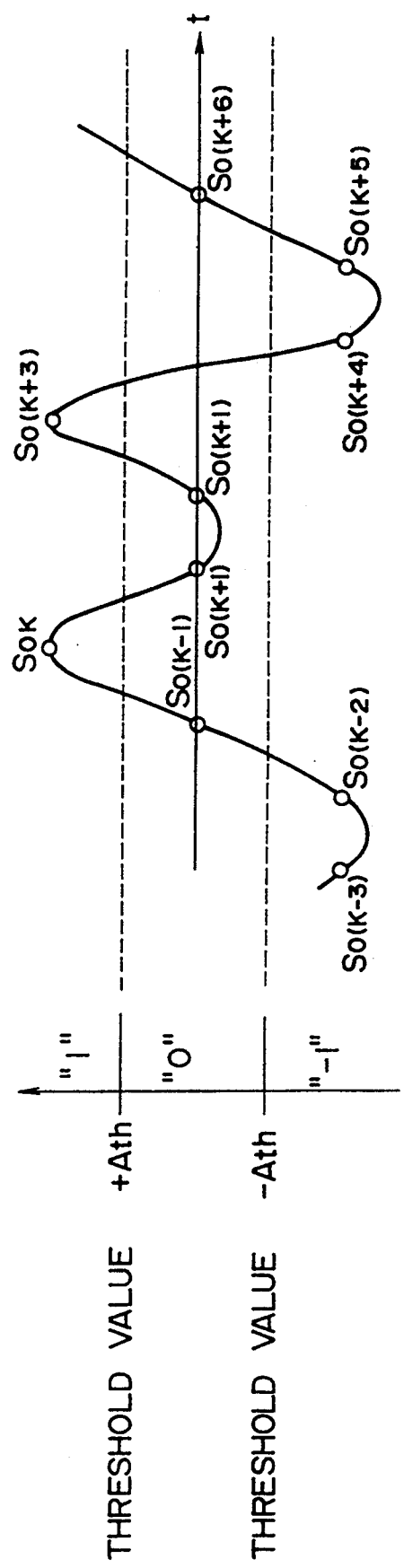
FIG. 15 is a view depicting the principles of computations for the ternary level predicting portion 40 of FIG. 1 to predict future data.
Figure 15C:
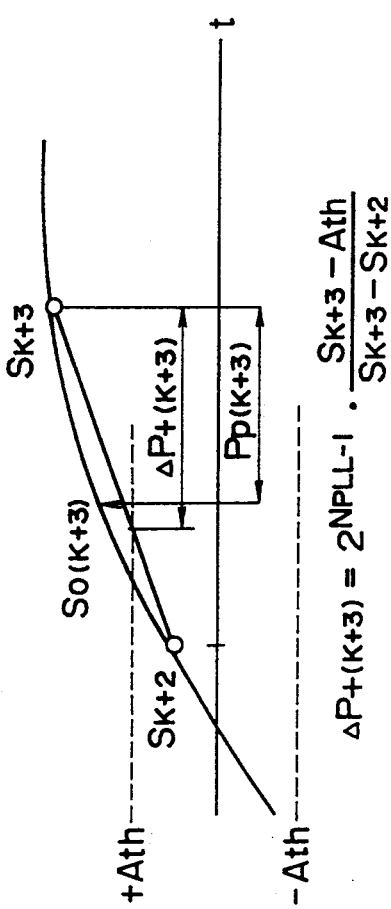
Figure 15B:
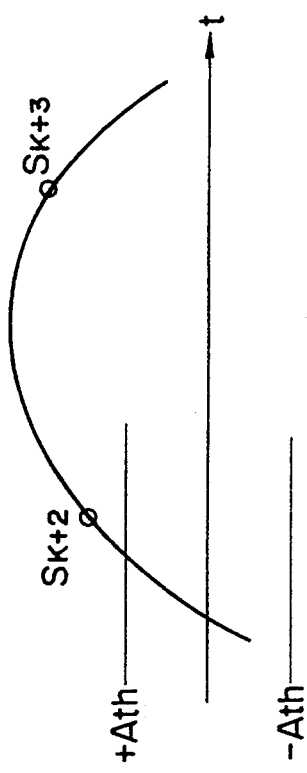
Figure 16:
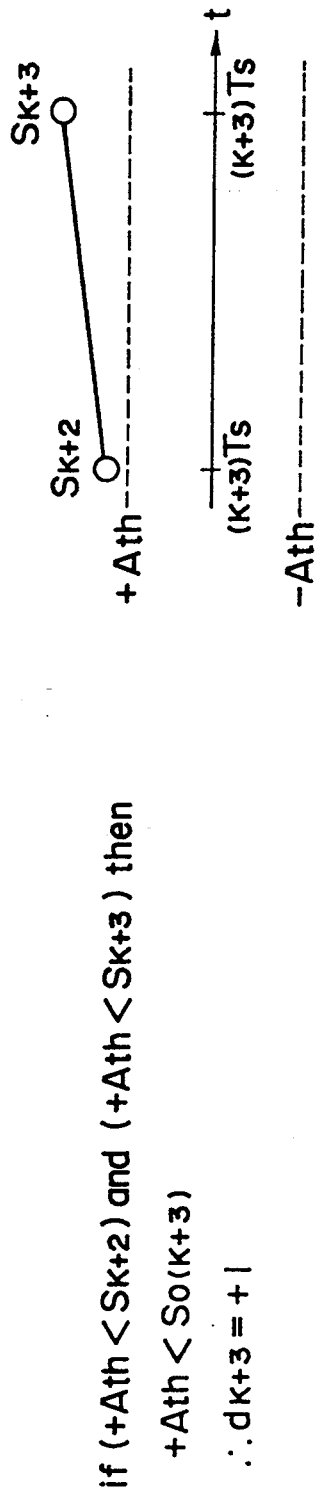
FIG. 16 is a view showing ternary level prediction determining rules in effect when both sampled values $Sk+2$ and $Sk+3$ are greater than a threshold value $+Ath$.
Figure 17:
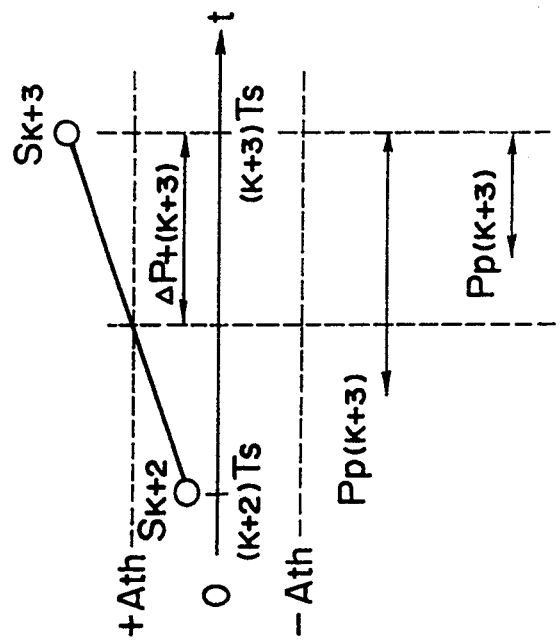
FIG. 17 is a view showing ternary level prediction determining rules in effect when the sampled value $Sk+2$ falls between the threshold value $-Ath$ and a threshold value $+Ath$, with the sampled value $Sk+3$ greater than the threshold value $+Ath$.
Figure 19:
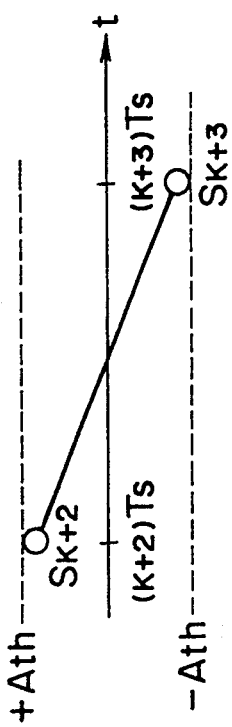
FIG. 19 is a view showing ternary level prediction determining rules in effect when the sampled value $Sk+2$ falls between the threshold values $-Ath$ and $+Ath$ and the sampled value $Sk+3$ falls also therebetween.
Figure 20:
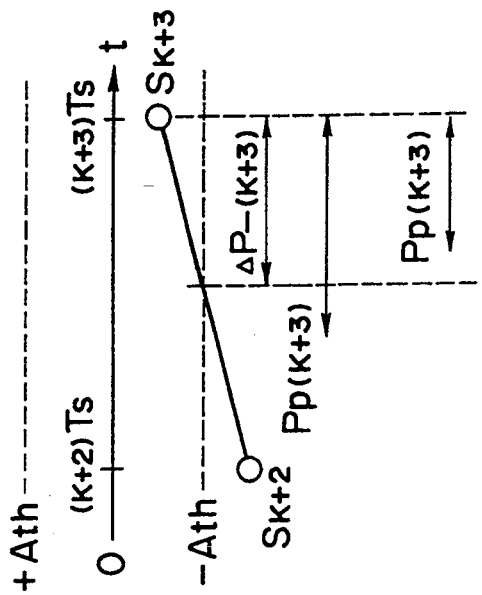
FIG. 20 is a view showing ternary level prediction determining rules in effect when the sampled value $Sk+2$ is smaller than the threshold value $-Ath$, with the sampled value $Sk+3$ falling between the threshold values $-Ath$ and $+Ath$.
Figure 21:
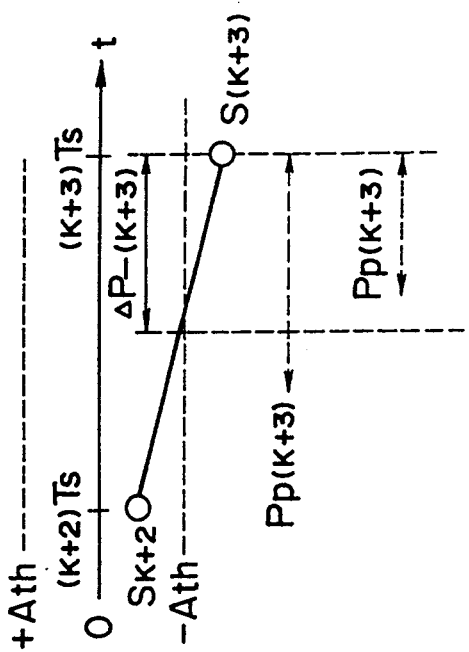
FIG. 21 is a view showing ternary level prediction determining rules in effect when the sampled value $Sk+2$ falls between the threshold values $-Ath$ and $+Ath$, with the sampled value $Sk+3$ smaller than the threshold value $-Ath$.
Figure 22:
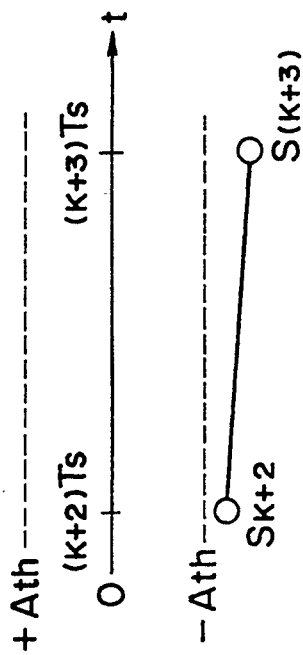
FIG. 22 is a view showing ternary level prediction determining rules in effect when the sampled values $Sk+2$ and $Sk+3$ are both smaller than the threshold value $-Ath$.
Figure 23:
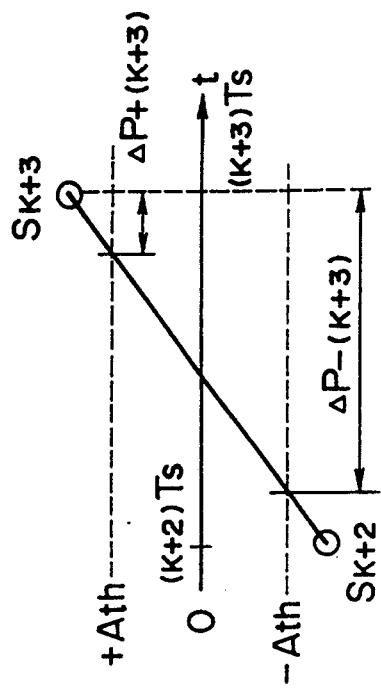
FIG. 23 is a view showing ternary level prediction determining rules in effect when the sampled value $Sk+2$ is smaller than the threshold value $-Ath$ and the sampled value $Sk+3$ greater than the threshold value $+Ath$.
Figure 24:
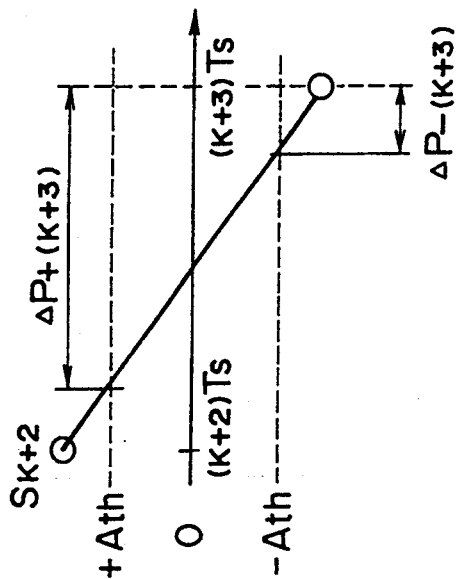
FIG. 24 is a view showing ternary level prediction determining rules in effect when the sampled value $Sk+2$ is greater than the threshold value $+Ath$ and the sampled value $Sk+3$ smaller than the threshold value $-Ath$.

The calculation of the signal waveform cross phase relying on primary linear interpolation utilizes Expressions (8) and (9) below. The calculation is based on the same principles as those of the instantaneous phase calculation described earlier.

$$\Delta P_{+(k+3)} = 2^{NPLL-i} \frac{S_{k+3} - A_{th}}{S_{k+3} - S_{k+2}} \quad (8)$$

$$\Delta P_{-(k+3)} = 2^{NPLL-i} \frac{S_{k+3} + A_{th}}{S_{k+3} - S_{k+2}} \quad (9)$$

where, Ath is an absolute threshold value for ternary level comparison. The principles of the computations above are illustrated in FIG. 15. FIG. 16 is a view showing ternary level prediction determining rules in effect when both sampled values Sk+2 and Sk+3 are greater than a threshold value +Ath. FIG. 17 is a view showing ternary level prediction determining rules in effect when the sampled value Sk+2 falls between the threshold value −Ath and a threshold value +Ath, with the sampled value Sk+3 greater than the threshold value +Ath. FIG. 18 is a view showing ternary level prediction determining rules in effect when the sampled value Sk+2 is greater than the threshold value +Ath, with the sampled value Sk+3 falling between the threshold values −Ath and +Ath. FIG. 19 is a view showing ternary level prediction determining rules in effect when the sampled value Sk+2 falls between the threshold values −Ath and +Ath and the sampled value Sk+3 falls also therebetween. FIG. 20 is a view showing ternary level prediction determining rules in effect when the sampled value Sk+2 is smaller than the threshold value −Ath, with the sampled value Sk+3 falling between the threshold values −Ath and +Ath. FIG. 21 is a view showing ternary level prediction determining rules in effect when the sampled value Sk+2 falls between the threshold values −Ath and +Ath, with the sampled value Sk+3 smaller than the threshold value −Ath. FIG. 22 is a view showing ternary level prediction determining rules in effect when the sampled values Sk+2 and Sk+3 are both smaller than the threshold value −Ath. FIG. 23 is a view showing ternary level prediction determining rules in effect when the sampled value Sk+2 is smaller than the threshold value −Ath and the sampled value Sk+3 greater than the threshold value +Ath. FIG. 24 is a view showing ternary level prediction determining rules in effect when the sampled value Sk+2 is greater than the threshold value +Ath and the sampled value Sk+3 smaller than the threshold value −Ath.

A valid signal generating portion 50 will now be described. The sampling rate of the input signal to the valid signal generating portion 50 is twice the channel bit rate. On average, one data item exists for two time slots. Although presumptive data detection is performed by the ternary level predicting portion 40 for all time slots, valid data are output only every two time slots on average. Thus it is necessary to generate and output a valid signal showing in which time slot valid data exist, i.e., in which time slot a zero-degree phase exists. The valid signal Vk is generated according to the rules of Expression (10) below using the PLL internal phase Pk:

If (Pk−1>Pk), then data are valid (zero-degree phase present in slot);

$$V_k = 1$$

else if (Pk−1≦Pk), then data are not valid (zero-degree phase absent in slot);

$$V_k = 0 \tag{10}$$

where, Pk is the phase at the sampling time t=kTs (end time of the k-th time slot). The phase value at the zero-degree phase time is 0. Each time slot is divided in virtual terms into $2^{N_{PLL}-1}$ quantized phases. Over time, each quantized phase value is incremented with modulo ($2^{N_{PLL}}$).

When $N_{PLL}=4$, the transition of the quantized phase in the k-th slot occurs as follows:

13, 14, 15, 0, 1, 2, 3, 4, 5

In this case, a zero-degree phase exists in the time slot, The phase value 13 of Pk−1 is incremented to reach 0 (where zero-degree phase exists). Then the value is incremented further to reach Pk=5. Thus the relation $$Pk-1 > Pk$$

holds.

Conversely, in the case where no zero-degree phase exists in the time slot, the transition of the quantized phase occurs as follows:

5, 6, 7, 8, 9, 10, 11, 12, 13

In this case, each quantized phase value is simply incremented and the relation $$Pk-1 > Pk$$

does not hold. The phase value 0 does not exist in the time slot, and the data detected in this slot are not valid. In the valid signal generating portion 50 of the embodiment in FIG. 1, a digital comparator compares the output Pk of the adder 25 in the loop filter 20 with the output Pk−1 of the phase register 26. The result is needed to execute the compare operation using Expression (10) above.

A mode switching control signal generating portion 60 will now be described. The generating portion 60 generates a mode switching control signal for selecting either synchronism establishing mode or decision-directed processing mode. Decision-directed processing involves predicting future zero-degree phases on the assumption that the past phase data held by the PLL are correct (i.e., the PLL is correctly locked to the zero-degree phase). Thus if it is desired to synchronize in phase with a sequence of input signals, a certain degree of synchronism at the beginning of the signal sequence is essential for subsequent decision-directed processing algorithms to work properly.

For the above reason, a preamble (a simple repetitive signal pattern portion for establishing synchronism) is attached to the beginning of the input signal sequence. With decision-directed processing not employed, all instantaneous phases are regarded as the zero-degree phase each to permit phase synchronization. The simple repetitive signal pattern for establishing synchronism is provided preferably by reproducing a signal recorded in the preamble zone of each magnetic disc sector.

Figure 25:
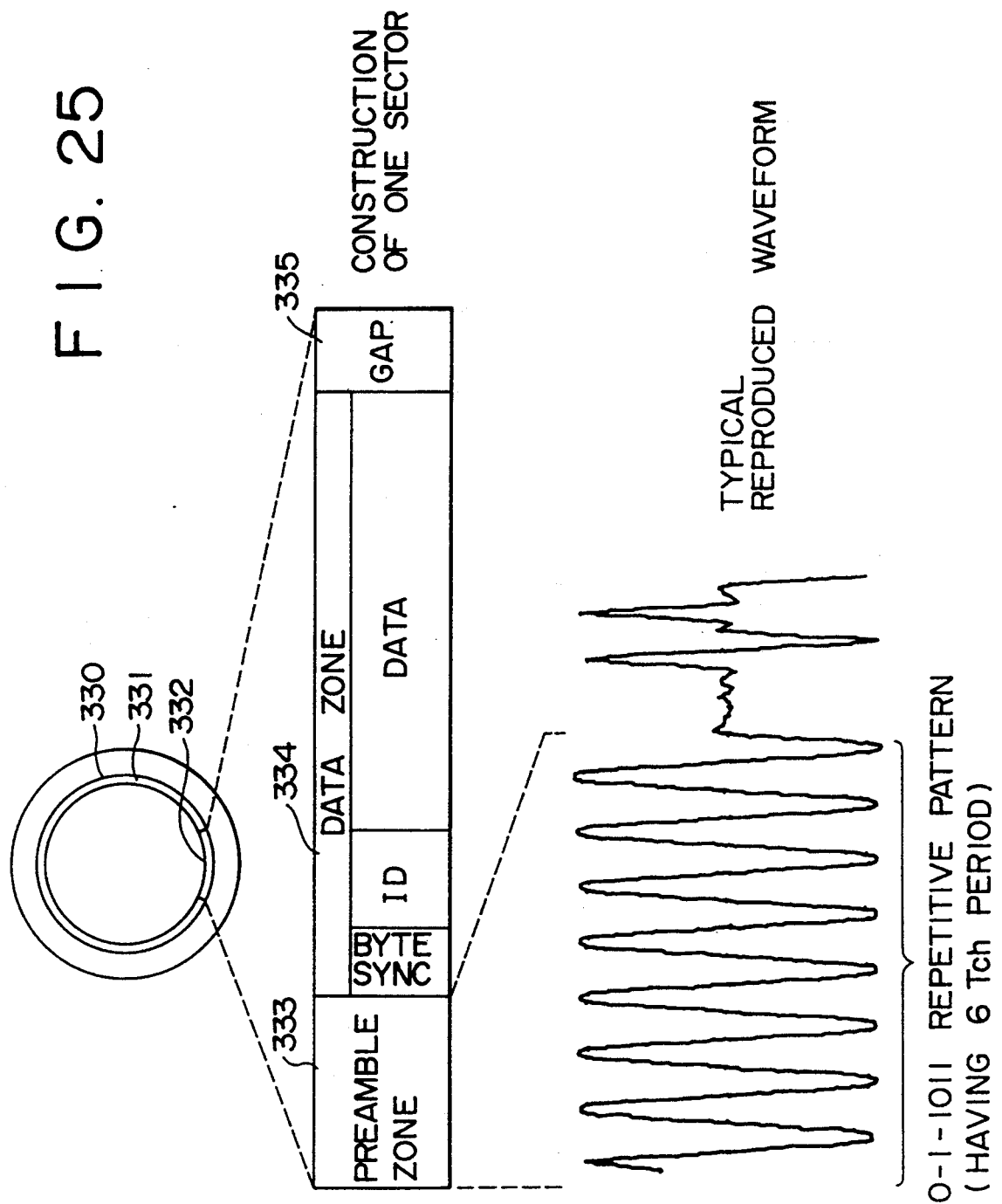
FIG. 25 is a view showing a typical sector construction of a magnetic disc as well as a repetitive pattern obtained from the preamble zone of each sector.

FIG. 25 is a view showing a typical sector construction of a magnetic disc as well as a repetitive pattern obtained from the preamble zone of each sector. In FIG. 25, a track 331 of the magnetic disc 330 is divided into a plurality of sectors 332. Each sector 332 contains a preamble zone 333, a data zone 334 and a gap 335. The preamble recorded in the zone 333 is a pattern repeated at intervals of 6 Tch. Where the reproduced signal on the PRS (1, 0, −1) channel is detected for ternary data, the pattern is

..., 1, 0, −1, −1, 0, 1, 1, 0, −1, −1, 0, 1, 1, ...

where, every zero cross point has a zero-degree phase. In the case of decision-directed processing according to the invention, correct synchronization with the zero-degree phase is achieved.

Phase synchronism based on the preamble scheme is accomplished in two modes: synchronism establishing mode and decision-directed processing mode. These modes are switched from one to the other.

In synchronism establishing mode, the PLL internal phase is modified using the instantaneous phase data at every zero cross point without recourse to decision-directed processing. Upon elapse of a predetermined period of time from the beginning of the sector, the other mode is selected. It is assumed that the starting time at the beginning of the sector is known by-suitable means separately provided in the magnetic disc unit. (For example, in a magnetic disc unit operating on the prior art sector servo principle, the servo circuit thereof furnishes a signal indicating the approximate position of the beginning of the sector.) Alternatively, decision-directed processing mode may be selected after a predetermined zero cross count is reached.

The signal from the preamble zone is kept reproduced for some time even after decision-directed processing mode is selected. The PLL in the embodiment of FIG. 1 maintains synchronism even as it detects data and performs decision-directed processing given the preamble pattern. With the preamble zone terminated in the sector, phase synchronization based on decision-directed processing is maintained over the data zone in which the phase continues to the preamble pattern.

A phase modification control signal generating portion 70 will now be described. The signal generating portion 70 comprises a combinational logic circuit or a ROM table arrangement that performs operations equivalent to those of the logic circuit. On receiving the detected zero cross output from the detecting portion 30 and the valid signal from the valid signal generating portion 50, the phase modification control signal generating portion 70 generates a phase modification control signal "modify_Pk." More specifically, the ternary data detected by the ternary level predicting portion 40 are represented as a two-bit twos complement word. This word is delayed through a shift register made of 6 pipeline registers 41, 42, 43, 44, 45 and 46 to become data dk+3, dk+2, dk+1, dk, dk−1, dk−2 and dk−3 for input to the phase modification control signal generating portion 70. The signal generating portion 70 then generates the phase modification control signal "modify_Pk" based on the above data, on the detected zero cross output of the detecting portion 30, on the valid signal from the valid signal generating portion 50 and on the mode switching control signal from the signal generating portion 60.

Care should be exercised to ensure causality for the valid signal. The phase control signal "modify_Pk" output by the phase modification control signal generating portion 70 controls PLL phase modification and affects the internal phase Pk. Because the valid signal is generated by a comparator 51 (a combinational logic circuit with no data stored therein) that receives the internal phase Pk as one of its inputs, feeding the output Vk of the comparator 51 unchanged to the portion 70 would disturb causality and lead to an unpredictable state. To prevent this, the output Vk is delayed by a D flip-flop circuit 52 yielding Vk−1. The output Vk−1 of the D flip-flop circuit 52 is inverted by an inverter 53 providing Vpk, a predicted value of Vk. Where phase synchronism is correct, valid and invalid states are alternated from one time slot to another. Thus the above-described process of one-step linear prediction almost always provides the correct valid signal. The basic operations of decision-directed processing mode involve applying the instantaneous phase value ΔPk obtained from a zero cross point to the phase modification of the PLL when the transition of the ternary data is predicted to occur in the order of −1, 0, +1, or in the order of +1, 0, −1.

In practice, if a jitter-plagued signal is input, the result of presumptive detection of the ternary data may not be 0 in the time slot where a zero cross point exists. A discrepancy between the instantaneous phase and the result of four-step linear phase prediction for presumptive determination can be such that the two values may switch their places chronologically relative to each other. Thus under the rules for generating the phase modification control signal "modify_Pk," decision-directed processing mode is divided into three sub-modes as shown in Expressions (11) and 12) that follow. In Expression (12), AND stands for a logical multiply operation and OR for a logical add operation.

$$
\begin{aligned}
&\text{if (Preamble = 1) then synchronism establishing mode is} \\
&\text{selected (phase modification at every zero-cross point);} \\
&\text{modify\_Pk = Zero\_cross\_k} \\
&\text{else if (Preamble = 0) then decision-directed processing} \\
&\text{mode is selected;} \\
&\text{modify\_Pk = (Zero\_cross\_k)AND(valid sequence)}
\end{aligned} \quad (11)
$$

$$
\begin{aligned}
\text{valid sequence} = \\
\{(V_k).\text{AND}.\{((d_{k-2}=1).\text{AND}.(d_k=0).\text{AND}.(d_{k+2}=-1)) \\
.\text{OR}.((d_{k-2}=-1).\text{AND}.(d_k=0).\text{AND}.(d_{k+2}=1))\}\} \\
.\text{OR}.\{(V_{k-1}).\text{AND}.\{((d_{k-3}=1).\text{AND}.(d_{k-1}=0).\text{AND} \\
(d_{k+1}=-1)) \\
.\text{OR}.((d_{k-3}=-1).\text{AND}.(d_{k-1}=0).\text{AND}.(d_{k+1}=1))\}\} \\
.\text{OR}.\{(V_{k+1}).\text{AND}.\{((d_{k-1}=1).\text{AND}.(d_{k+1}=0) \\
.\text{AND}.(d_{k+3}=-1)) \\
.\text{OR}.((d_{k-1}=-1).\text{AND}.(d_{k+1}=0).\text{AND}.(d_{k+3}=1))\}\}
\end{aligned} \quad (12)
$$

In decision-directed processing mode, the phase modification control signal "modify_Pk"=1. The phase of the PLL, i.e., the loop filter 20 is modified in any one of the following cases:

(1) The case where a zero cross point exists in the current k-th time slot, where the time slot is valid (i.e., zero-degree phase present), and where the transition of the ternary data sequence ($d_{k-2}$, $d_k$, $d_{k+2}$) is predicted to occur in the order of −1, 0, +1, or in the order of +1, 0, −1.

(2) The case where a zero cross point exists in the current k-th time slot and where the above-mentioned transition occurs with the (k−1)th time slot (i.e., the immediately preceding time slot) located in the middle. In this case, Vk−1 is used as the valid signal. Alternatively, Vk may be inverted for use as the valid signal.

(3) The case where a zero cross point exists in the current k-th time slot and where the above-mentioned transition occurs with the (k+1)th time slot (i.e., the immediately following time slot) located in the middle. Although this case would require Vk+1 as the valid signal, Vk+1 is replaced by Vk that is inverted for two-step linear prediction from Vk−1.

The rules given by Expressions (11) and 12) are readily implemented using a combinational logic gate circuit, a PLD or a ROM table lookup arrangement. Thus the phase modification control signal generating portion 70 is practiced with ease by use of any of these means.

In decision-directed processing mode, the signal generating portion 70 generates the phase modification control signal "modify_Pk" based on the valid signal from one-step future prediction and on the data detected in the phase. Pp(k+3) from four-step future prediction. This means that the signal "modify_Pk" could be generated because of a prediction error. However, the probability of such error incidence is negligible. Even if the phase is modified so as to follow the instantaneous phase at incorrect zero cross points, the PLL internal phase is not much disturbed because the modification coefficient $\alpha$ is sufficiently small (about $0 < \alpha \leq 0.5$ in general). In that case, the subsequent correct instantaneous phase is soon followed.

Figure 26:
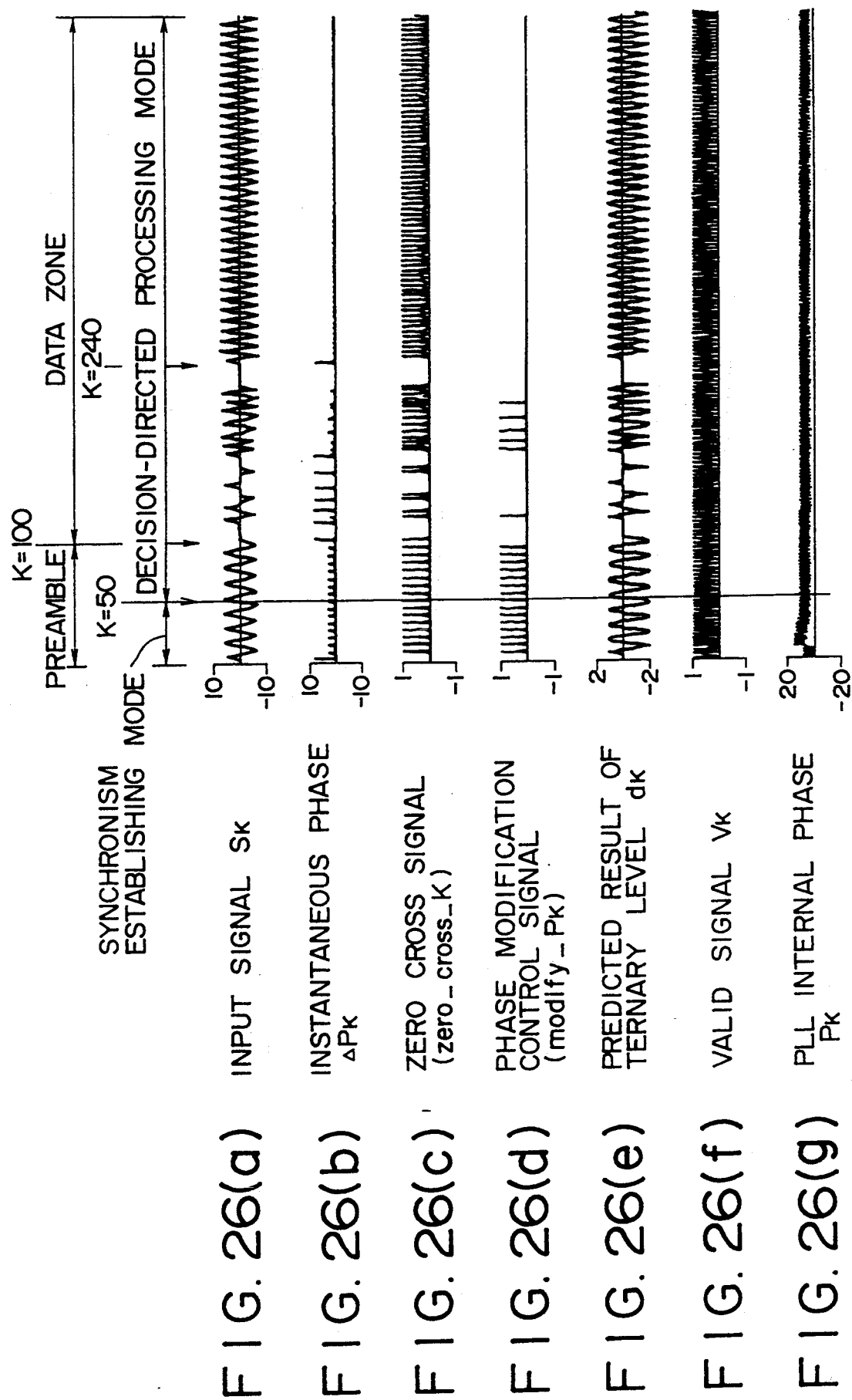
FIG. 26 is a view of waveforms representing signals output by various parts of the embodiment of FIG. 1 as it operates.
Figure 27:
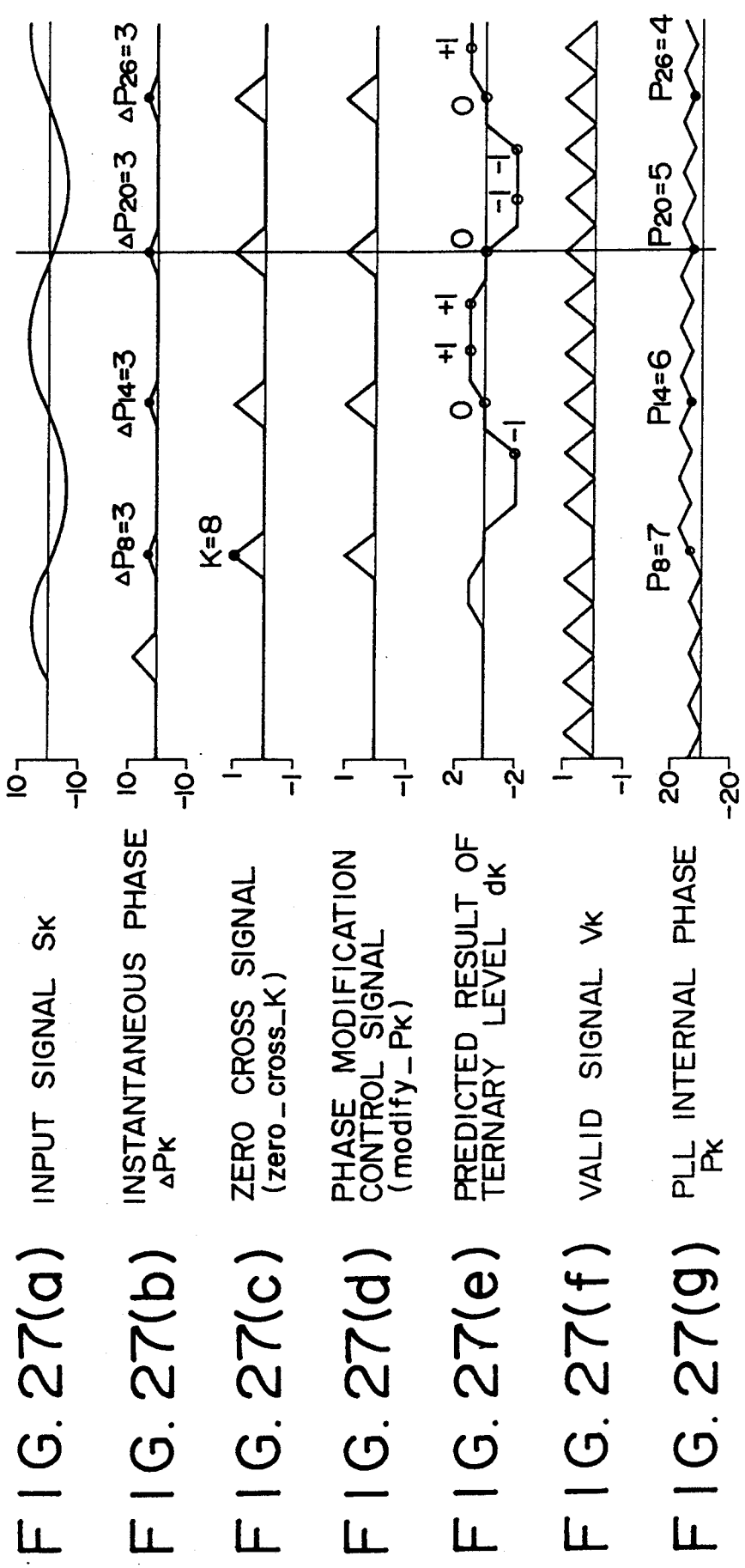
FIG. 27 is a view of waveforms representing signals output by various parts of the embodiment of FIG. 1 in synchronism establishing mode.
Figure 28:
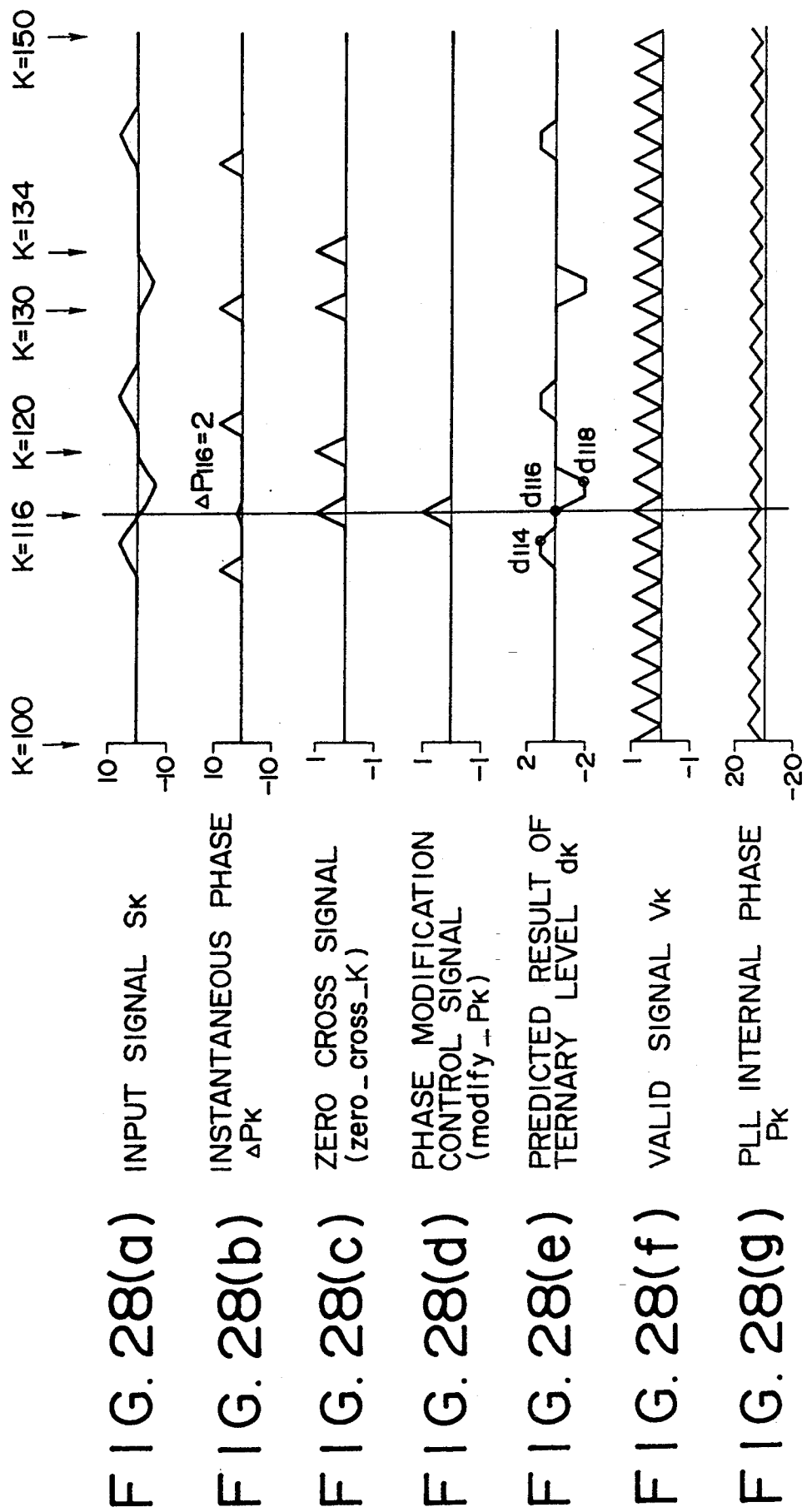
FIG. 28 is a view of waveforms representing signals output by various parts of the embodiment of FIG. 1 in decision-directed processing mode.
Figure 29:
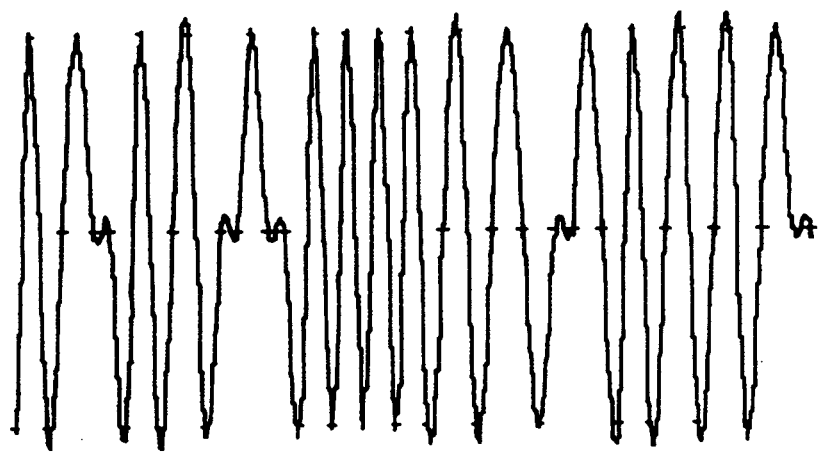
FIG. 29 is a view of a typical waveform representing a reproduced signal from the PRS (1, −1) channel.
Figure 30:
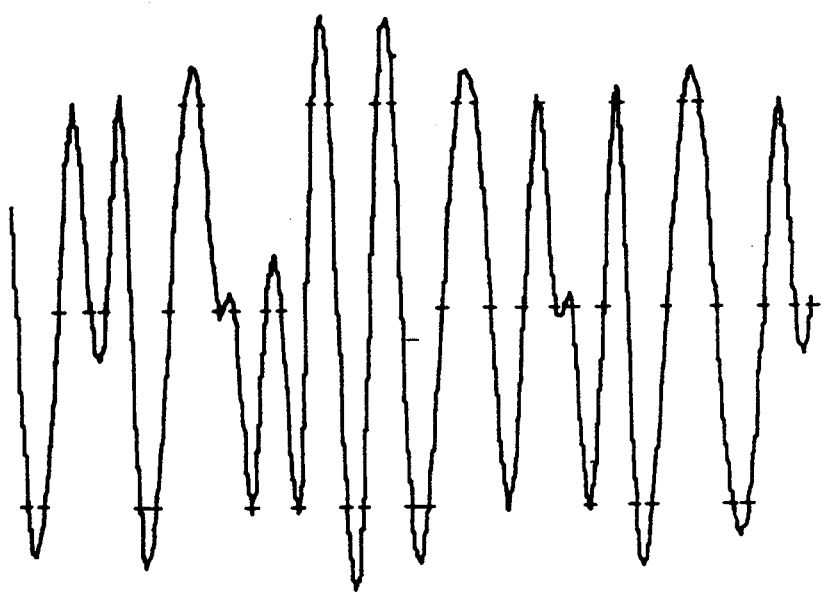
FIG. 30 is a view of a typical waveform representing a reproduced signal from the PRS (1, 0, −1) channel.
Figure 31:
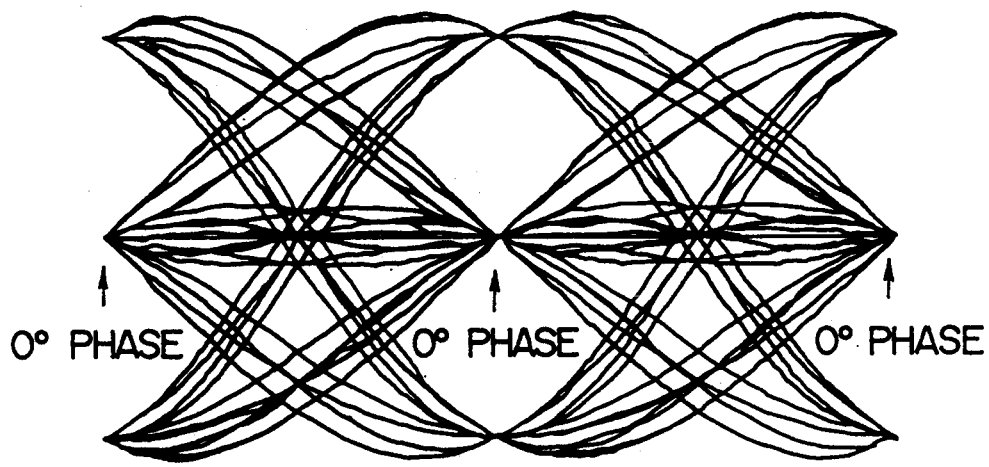
FIG. 31 is a view of a typical eye pattern waveform representing a reproduced signal from the PRS (1, −1) channel.

Described below is how the embodiment of FIG. 1 works on the time base with reference to FIGS. 26 through 28. FIG. 26 is a view of waveforms showing 512 samples of signals output by various parts of the embodiment. Each of the signals sampled in FIG. 26 has the following meaning:

(a) Input signal Sk

This signal has a waveform produced by first having an A/D converter sample the output waveform of an electromagnetic conversion system made of a head mechanism and recording medium, and then by equalizing the sampled waveform through a digital equalizer to be compatible with the PRS (1, 0, −1) channel. The input signal Sk is expressed in four-bit twos complement notation and is an integer that falls within a range of $-8 \leq Sk \leq 7$. About 100 wave samples at the beginning correspond to the preamble zone. This is a repetitive pattern repeated at intervals of 6 Tch, with 12 samples making up one interval. The preamble zone is followed by the data zone.

(b) Instantaneous phase ΔPk

This signal is output by the instantaneous phase detecting portion 10. According to Expression (4), the signal is an integer that falls within a range of $0 \leq \Delta Pk \leq 8$. In FIG. 28, the peak of each triangular pulse wave represents a sampled value (the same also holds for the other signals).

(c) Zero cross signal "zero_cross_k"

This signal is the output of the zero cross detecting portion 30. The signal takes a value of either 1 or 0.

(d) Phase modification control signal "modify_Pk"

This signal is the output of the phase modification control signal generating portion 70. The signal also takes a value of either 1 or 0.

(e) Detected result of ternary level dk

This signal is the detected result of the ternary level predicting portion 40 and is delayed by registers 41, 42 and 43. The signal is twos complement data that take one of three values: −1, 0 or +1. In FIG. 28, the value −1 is represented as −2.

(f) Valid signal Vk

This signal is the output of the valid signal generating portion 50. A value of 1 (peak of a triangular pulse wave) stands for a valid state and a 0 for an invalid state.

(g) PLL internal phase Pk

This signal is the modified phase value in effect at the time k. At that time, the value is input to the phase register 26 of the PLL, i.e., the loop filter 20.

The overall workings of the embodiment of FIG. 1 will be first described with reference to FIG. 26. At the beginning of the input signal Sk, the phase-locked loop circuit, i.e., the decision-directed DPLL in FIG. 1 operates in synchronism establishing mode up to the 50th sample in the preamble zone. Thereafter, the mode switching control signal generating portion 60 replaces synchronism establishing mode with decision-directed processing mode.

How the embodiment works in decision-directed processing mode will now be described. FIG. 27 is a view showing enlarged waveforms of 30 samples taken from what is depicted in FIG. 26 with respect to the workings of the embodiment in synchronism establishing mode. In FIG. 27, the initial value of the PLL phase Pk is P0=8 at the time of k=0. This is where the initial phase modification takes place. Until k=8, Pk takes on values of 8, 0, 8, 0, 8, 0, etc. That is, the PLL runs by itself. When k=8, S7=2 and S8=−1 in the input signal Sk. With a zero cross point present, the signal "zero_cross_8"=1. At the same time, the instantaneous phase detecting portion 10 calculates the instantaneous phase $\Delta P8$ and inputs the phase to the loop filter 20. In turn, the loop filter 20 modifies the internal phase from P6=8 to P8=7 according to Expression (3).

No zero cross point exists at times of k=9, 10, 11, 12 or 13, and thus no phase modification occurs. At the time of k=14, a zero cross point is again present, and the instantaneous phase $\Delta P14=3$ is input to the loop filter 20 accordingly. This modifies the input phase to P14=6. Because the modification coefficient is small (i.e., $\alpha=0.125$) in this example, internal phase modification occurs slowly. The phase modification is carried out at times of k=8, 14, 20, 26, 32, 38, 44, 50, etc. Every time the phase modification is performed, the internal phase value Pk of the DPLL is modified so as to approach the instantaneous phase value $\Delta Pk$. When k=32, the two phase values become the same and synchronism is established.

The synchronism establishing operation up to this point has been performed in synchronism establishing mode in which all instantaneous phase values are input. After this, the steady state of established synchronism continues from the time k=33 to k=50. As shown in FIG. 26, the predicted results of ternary levels remain regularly repetitive during this period, occurring as 0, +1, +1, 0, −1, −1, 0, etc. The data for decision-directed processing are also detected correctly. The valid signal Vk also repeats the pattern of . . . , 0, 1, . . . per sample.

The workings of the embodiment in decision-directed processing mode will now be described. After k=50, the mode switching control signal generating portion 60 selects decision-directed processing mode. Since synchronism has now been established, the ternary level predicting portion 40 correctly performs presumptive data detection. As a result, all zero cross points between k=50 and k=100 entail the transition in the order of −1, 0, +1, or in the order of +1, 0, −1. The output signal "modify_Pk" of the phase modification control signal generating portion 70 coincides with the zero cross signal "zero_cross_k."

What follows is a description of the decision-directed processing in the data zone. In the example of FIG. 26, the signal Sk remains 0 between k=100 and k=111. Thus no zero cross point exists and the DPLL runs by itself. After k=112, data are recorded. Phase modification is carried out while checks are being made to see if the current zero cross point is of zero-degree phase. FIG. 28 is a view of enlarged waveforms in effect between k=100 and k=150. In FIG. 28, a zero cross point exists at the time of k=116. A look at the predicted ternary data dk indicates that d114=+1, d116=0 and d118=−1. (The data starting from the valid signal Vk up to an even-numbered point in time are valid; the data detected at an odd-numbered point in time have no meaning.) Thus the zero cross point has a zero-degree phase, and the instantaneous phase value $\Delta P116=2$ at that point is used for phase modification.

At k=120 where the next zero cross point exists, the sequence of the predicted ternary data is dk=−1, dk=0, dk=0; this means that the requirements for the zero-degree phase are not met. Thus "modify_P120"=0 and no phase modification takes place. Likewise the requirements for the zero-degree phase are not met at k=130 and k=134, with no phase modification carried out.

From the time of k=240 onward, the signal waveform takes a pattern with a 4 Tch cycle in which zero cross points occur only in 180-degree phases. Although the zero cross signal "zero_cross_k" often takes the value 1, none of the requirements for decision-directed processing is met. Thus the signal "modify_Pk"=0 and no phase modification is performed.

Although the above-described embodiment applies to the setup with the PRS (1, 0, −1) channel, the embodiment is not limitative of the invention. The embodiment also applies to PRS (1, −1) channel applications.

As described, in the decision-directed phase-locked loop embodying the invention, the phase value of a future data existing point is first obtained on the basis of the phase value of the current data existing point in the reproduced signal output from the digital loop filter. Future data of the reproduced signal are predicted based on the phase value of the future data existing point and on future sampled values of the reproduced signal. Given the predicted future data, a check is made to see if the current zero cross point of the reproduced signal is a data existing point. If the current zero cross point is found to be a data existing point, the digital loop filter modifies its output phase value using the instantaneous phase value of the zero cross point. This scheme prevents phase synchronization in opposite phases where data do not exist and permits synchronism only with phases where data exist. It follows that jitters do not increase in data-existing phases upon input of an opposite instantaneous phase to the phase-locked loop circuit being synchronized. As a secondary benefit, reproduced signal data may be detected. Because all functional blocks in the data detection including the phase-locked loop circuit can be implemented using digital circuits that operate in synchronism at a fixed clock rate, the data detection circuit, ECC decoder, controller and other related parts may be readily built in the same LSI. This makes the whole product smaller in size and less expensive to build, with its LSI design and testing procedures significantly simplified. With no externally attached analog parts required, the product may be shipped unadjusted from the factory. The product also proves to be much less vulnerable to aged deterioration.

While a preferred embodiment of the invention has been described using specific terms, such description is for illustrative purposes only, and it is to be understood that changes and variations may be made without departing from the spirit or scope of the following claims.

What is claimed is:

1. A decision-directed digital phase-locked loop, comprising:
   (a) instantaneous phase detecting means for obtaining an instantaneous phase digital value of a current zero cross point of a reproduced signal from a partial response channel based on a plurality of sampled values of said reproduced signal;
   (b) a digital loop filter for obtaining and outputting a phase value of a current data existing point of said reproduced signal in response to the instantaneous phase digital value obtained by said instantaneous phase detecting means;
   (c) phase value predicting means for obtaining a phase value of a future data existing point based on the phase value output by said digital loop filter of the current data existing point of said reproduced signal;
   (d) data predicting means for predicting future data of said reproduced signal based on the phase value of said future data existing point obtained by said phase value predicting means as well as on future sampled values of said reproduced signal; and
   (e) phase modification control means for determining, based on the future data predicted by said data predicting means, whether the current zero cross point of said reproduced signal is a data existing point, and for allowing said digital loop filter to modify the output phase value thereof using said instantaneous phase value when said current zero cross point is found to be a data existing point.

2. A decision-directed digital phase-locked loop according to claim 1, further comprising valid signal generating means for outputting to said phase modification control means a valid signal when a sampling rate of said reproduced signal is set higher than a channel bit rate thereof, said valid signal indicating that the data existing point of said reproduced signal exists in a current sampling time slot; and wherein said phase modification control means allows said digital loop filter to modify the output phase value thereof using said instantaneous phase value only when said modification control means receives said valid signal from said valid signal generating means.

3. A decision-directed digital phase-locked loop according to claim 1, wherein said reproduced signal is obtained by having a reproduction head read magnetic patterns recorded on a magnetic disc.

4. A decision-directed digital phase-locked loop according to claim 1, wherein said reproduced signal comes from a partial response (1, 0, −1) channel.

5. A decision-directed digital phase-locked loop according to claim 1, wherein said reproduced signal comes from a partial response (1, −1) channel.

6. A decision-directed digital phase-locked loop according to claim 1, further comprising:
   initial pattern supplying means for supplying said instantaneous phase detecting means with a predetermined repetitive signal pattern of said partial response channel during initialization; and
   mode switching control means for causing said phase modification control means to switch said digital loop filter between control modes so that said digital loop filter will modify the output phase value thereof using said instantaneous phase value at all zero cross points of said repetitive signal pattern.

7. A decision-directed digital phase-locked loop according to claim 6, wherein said initial pattern supplying means generates said predetermined repetitive signal pattern based on the signal recorded in a preamble zone of a magnetic disc sector.

8. A decision-directed digital phase-locked loop, comprising:
   an instantaneous phase detector for obtaining an instantaneous phase digital value of a current zero cross point of a reproduced signal from a partial response channel based on a plurality of sampled values of said reproduced signal;
   a digital loop filter for obtaining and outputting a phase value of a current data existing point of said reproduced signal in response to the instantaneous phase digital value obtained by said instantaneous phase detector;
   a phase value predictor for obtaining a phase value of a future data existing point based on the phase value output by said digital loop filter of the current data existing point of said reproduced signal;
   a data predictor for predicting future data of said reproduced signal based on the phase value of said future data existing point obtained by said phase value predictor as well as on future sampled values of said reproduced signal; and
   a phase modification control for determining, based on the future data predicted by said data predictor, whether the current zero cross point of said reproduced signal is a data existing point, and for allowing said digital loop filter to modify the output phase value thereof using said instantaneous phase value when said current zero cross point is found to be a data existing point.

* * * * *